US008400854B2

(12) United States Patent  (10) Patent No.: US 8,400,854 B2
Pei et al.  (45) Date of Patent: Mar. 19, 2013

(54) IDENTIFYING AT-RISK DATA IN NON-VOLATILE STORAGE

(75) Inventors: Gen Pei, Sunnyvale, CA (US); Lanlan Gu, San Jose, CA (US); Nima Mokhlesi, Los Gatos, CA (US); Idan Alrod, Herzliya (IL); Eran Sharon, Rishon Lezion (IL); Itshak Afriat, Tel-Mond (IL)

(73) Assignee: SanDisk Technologies Inc., Plano, TX (US)

( * ) Notice: Subject to any disclaimer, the term of this patent is extended or adjusted under 35 U.S.C. 154(b) by 357 days.

(21) Appl. No.: 12/694,118

(22) Filed: Jan. 26, 2010

(65) Prior Publication Data

US 2011/0063918 A1  Mar. 17, 2011

Related U.S. Application Data

(60) Provisional application No. 61/241,750, filed on Sep. 11, 2009.

(51) Int. Cl.
 *G11C 29/04* (2006.01)
 *G11C 29/06* (2006.01)

(52) U.S. Cl. ........................................ 365/201; 365/184

(58) Field of Classification Search .................. 365/184, 365/201
See application file for complete search history.

(56) References Cited

U.S. PATENT DOCUMENTS

| | | | |
|---|---|---|---|
| 4,393,475 A * | 7/1983 | Kitagawa et al. | ........ 365/185.21 |
| 5,475,693 A | 12/1995 | Christopherson | |
| 7,009,895 B2 | 3/2006 | Bunce | |
| 7,023,737 B1 | 4/2006 | Wan | |
| 7,142,471 B2 | 11/2006 | Fasoli | |
| 7,206,231 B2 | 4/2007 | Wan | |
| 7,230,854 B2 | 6/2007 | Wan | |
| 7,237,074 B2 | 6/2007 | Guterman | |
| 7,301,817 B2 | 11/2007 | Li | |
| 7,339,834 B2 | 3/2008 | Lutze | |
| 7,356,442 B1 | 4/2008 | Astigarraga | |
| 7,366,022 B2 | 4/2008 | Li | |
| 7,492,634 B2 | 2/2009 | Li | |
| 7,551,477 B2 | 6/2009 | Mokhlesi | |
| 7,559,004 B1 | 7/2009 | Chang | |
| 7,561,482 B2 | 7/2009 | Tu | |
| 7,564,711 B2 | 7/2009 | Mokhlesi | |
| 7,564,715 B2 | 7/2009 | Mokhlesi | |
| 7,616,495 B2 | 11/2009 | Mokhlesi | |
| 7,616,500 B2 | 11/2009 | Mokhlesi | |
| 7,619,930 B2 | 11/2009 | Mokhlesi | |
| 2007/0002638 A1 * | 1/2007 | Ohtake et al. | ............ 365/189.05 |
| 2007/0198786 A1 | 8/2007 | Bychkov | |
| 2008/0158959 A1 | 7/2008 | Mokhlesi | |
| 2009/0040827 A1 | 2/2009 | Kim | |
| 2009/0150748 A1 | 6/2009 | Egner | |
| 2009/0244977 A1 | 10/2009 | Mokhlesi | |
| 2010/0246257 A1 | 9/2010 | Ito | |

OTHER PUBLICATIONS

Patent Application and Filing Receipt for U.S. Appl. No. 12/414,567, filed Mar. 30, 2009.
PCT International Search Report dated Mar. 24, 2011, PCT Patent Appl. No. PCT/US2010/047951.
Written Opinion of the International Searching Authority dated Mar. 24, 2011, PCT Patent Appl. No. PCT/US2010/047951. Response to Office Action dated Oct. 29, 2012, European Patent Application No. 10771552.6.

* cited by examiner

*Primary Examiner* — Hoai V Ho
*Assistant Examiner* — Jay Radke
(74) *Attorney, Agent, or Firm* — Vierra Magen Marcus LLP

(57) ABSTRACT

The non-volatile storage system predicts which blocks (or other units of storage) will become bad based on performance data. User data in those blocks predicted to become bad can be re-programmed to other blocks, and the blocks predicted to become bad can be removed from further use.

31 Claims, 19 Drawing Sheets

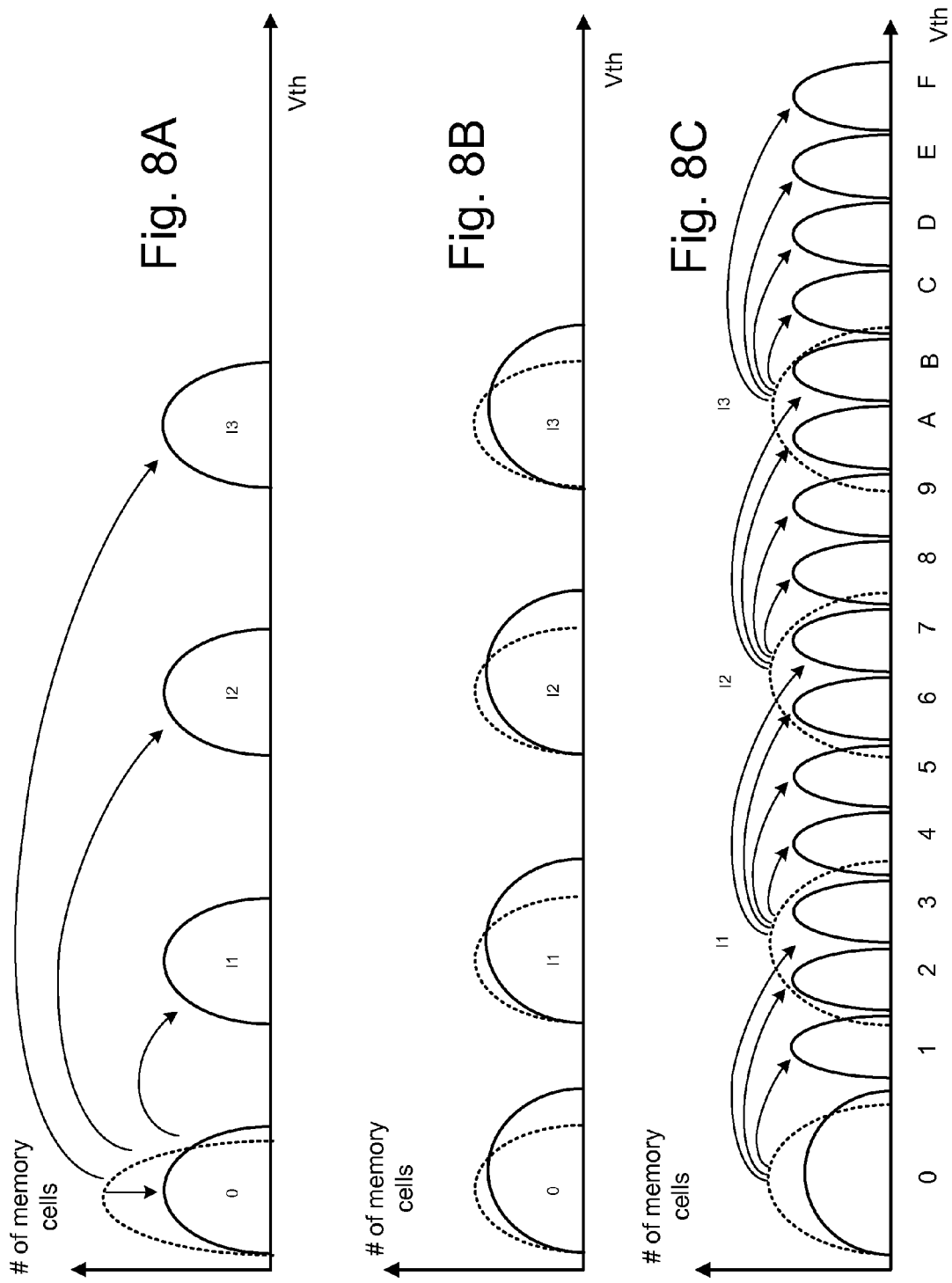

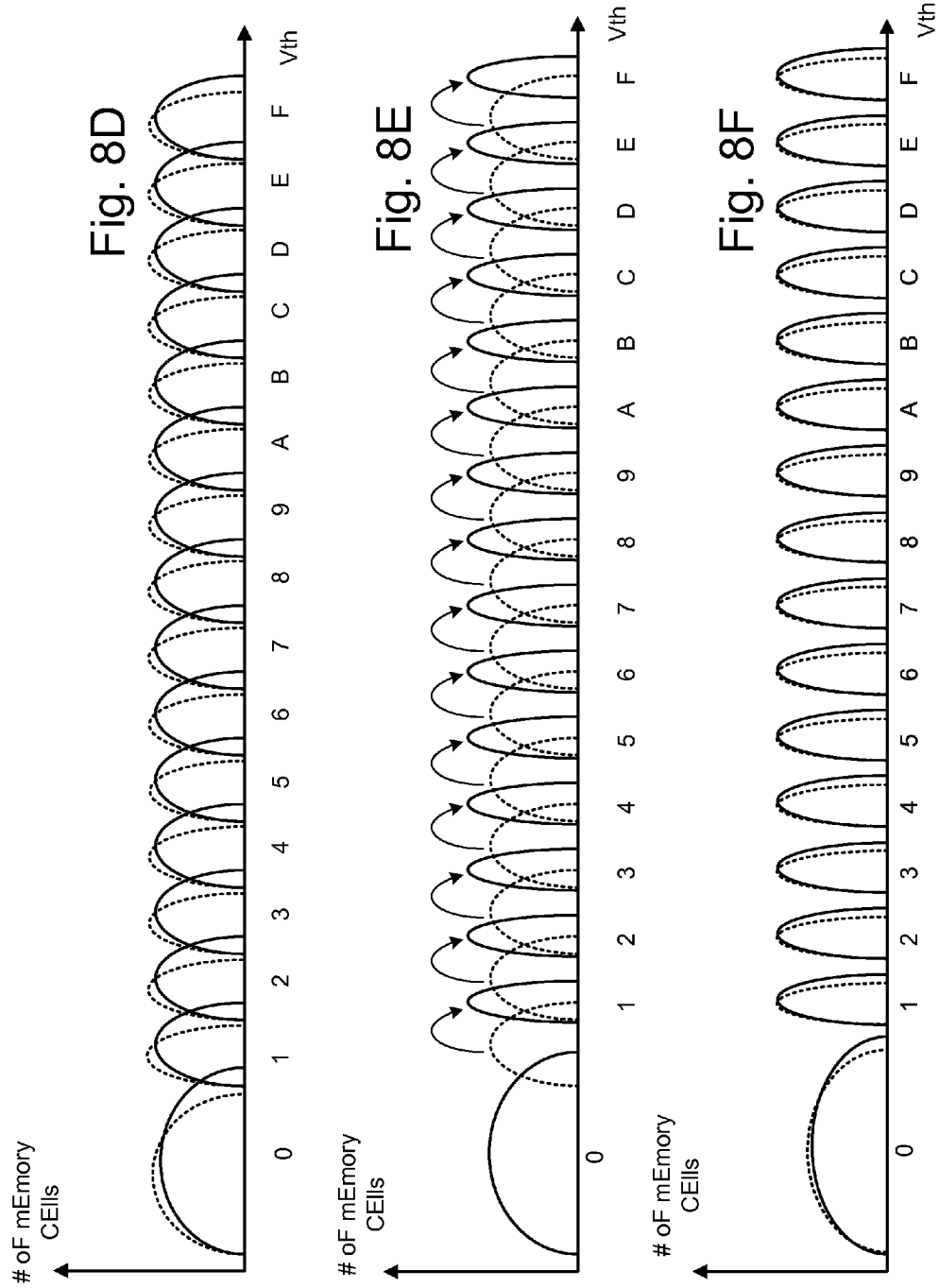

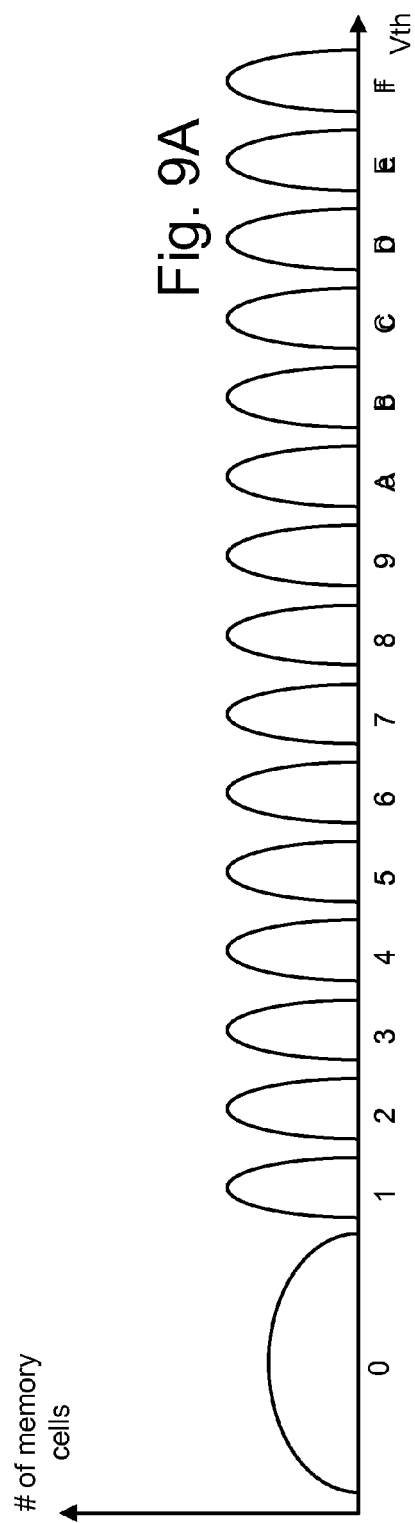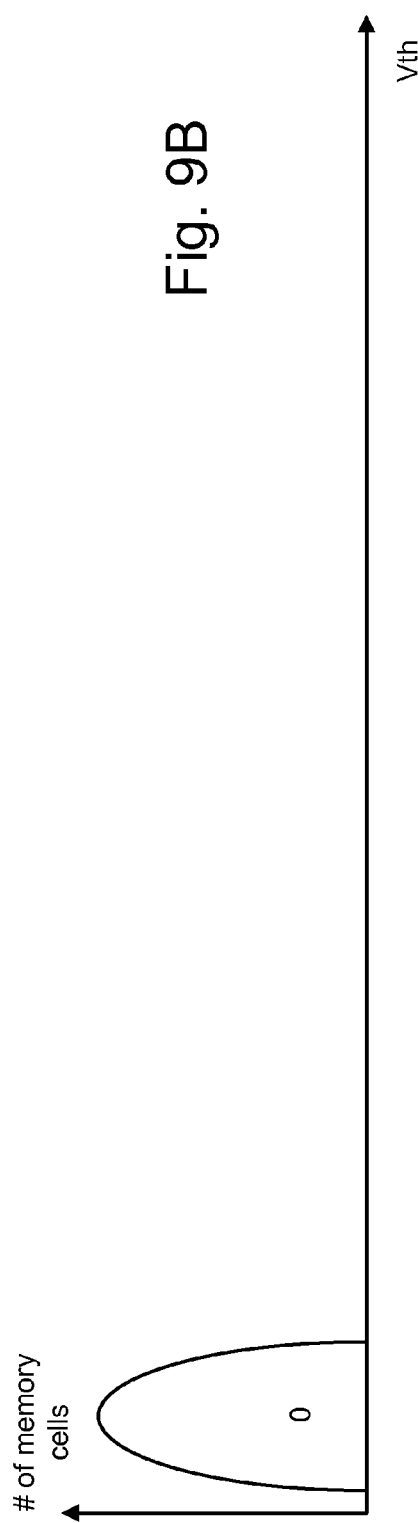

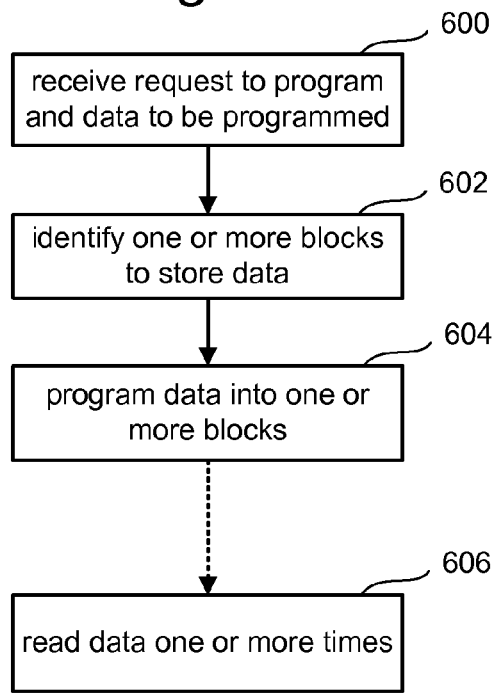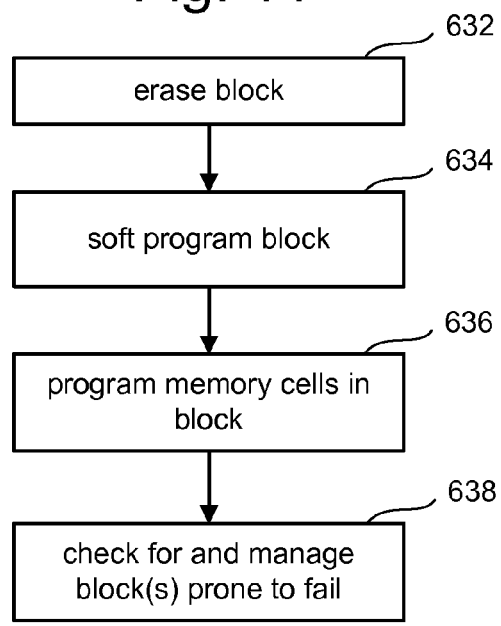

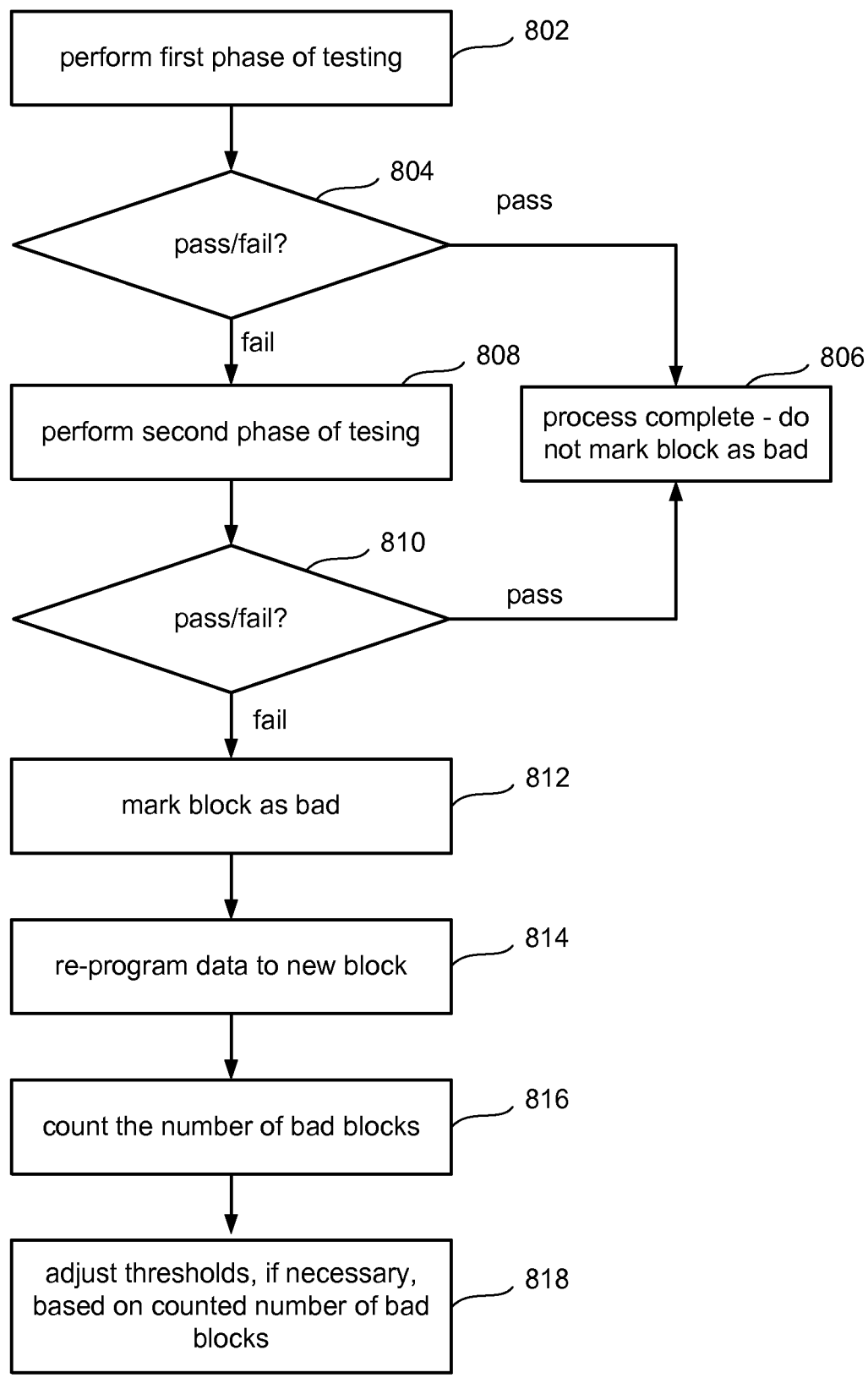

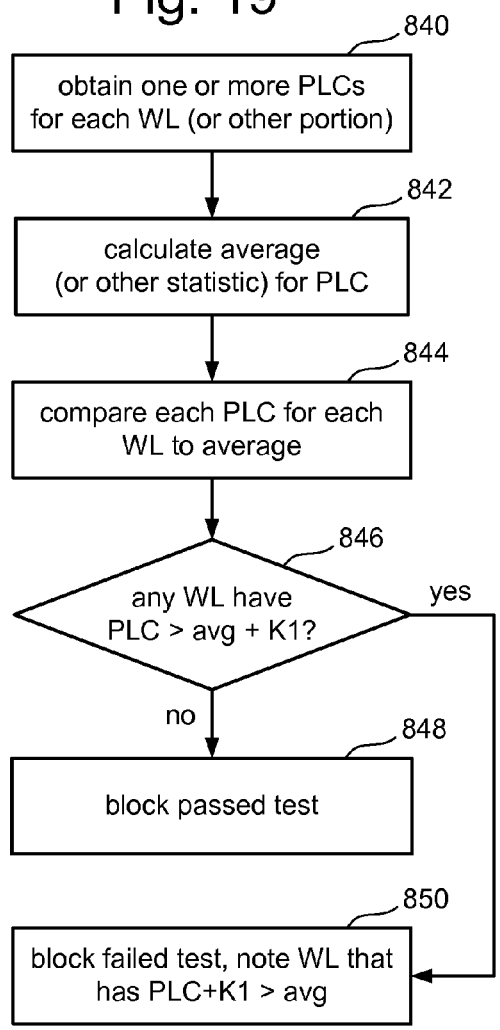
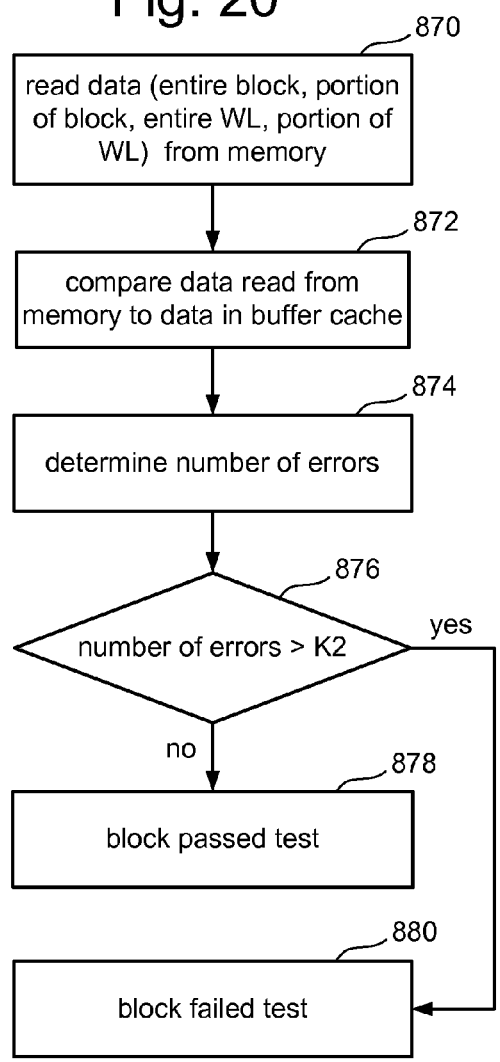

IDENTIFYING AT-RISK DATA IN NON-VOLATILE STORAGE

This application claims the benefit of U.S. Provisional Application 61/241,750, filed on Sep. 11, 2009.

BACKGROUND OF THE INVENTION

1. Field

The present invention relates to non-volatile storage.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. More information about programming can be found in U.S. Pat. No. 6,859,397, titled "Source Side Self Boosting Technique For Non-Volatile Memory," and in U.S. Pat. No. 6,917,542, titled "Detecting Over Programmed Memory;" both patents are incorporated herein by reference in their entirety.

Some EEPROM and flash memory devices have a floating gate that is used to store two ranges of charges and, therefore, the memory cell can be programmed/erased between two states, an erased state and a programmed state that correspond to data "1" and data "0." Such a device is referred to as a binary device or as having single level memory cells.

A multi-state (or multi-level) flash memory cell is implemented by identifying more than two distinct allowed threshold voltage ranges. Each distinct threshold voltage range corresponds to a predetermined value for the set of data bits.

Non-volatile memory, like other integrated circuits, are susceptible to manufacturing defects. Some manufacturing defects are severe enough so that the integrated circuit never functions properly. These defects are typically found by testing during the manufacturing phase.

Other defects are minor or otherwise are not revealed until the integrated circuit has been used for a period of time. Some memory manufacturers attempt to identify the bad units as part of the manufacturing process. For example, some testing methods for flash memory include applying stress (temperature, voltage, cycling) to each block of memory in an effort to accelerate the failure of the blocks of memory that have defects which may cause failure after a period of operation. In some cases, the memory is programmed after or during the stress, the data programmed is read back, and the original data is compared with the data programmed and read back. If the difference is larger than some predefined threshold, the block is marked as bad and never used. A set of spare blocks exists to accommodate for bad blocks such that the total device capacity is within the product specification. A second scenario includes identifying a bad block when a programming or erasing operation fails. The failing block can be marked as bad and never used again.

None of the testing solutions described above can detect the situation where a programming process is successful, but the memory device later deteriorates (even without being accessed or only accessed for reading) and gradually loses its contents or the ability to read its contents.

BRIEF DESCRIPTION OF THE DRAWINGS

FIGS. 8A-F depicts threshold voltage distributions of memory cells during a programming process.

FIGS. 9A and B depict threshold voltage distributions of memory cells during an erase process.

FIG. 10 is a flow chart describing one embodiment of a process for operating non-volatile memory.

FIG. 11 is a flow chart describing one embodiment of a process for programming data into non-volatile memory.

FIG. 18 is a flow chart describing one embodiment of a process for checking whether blocks are prone to fail.

FIG. 19 is a flow chart describing one embodiment of a process for performing a test when checking whether blocks are prone to fail.

FIG. 20 is a flow chart describing one embodiment of a process for performing a test when checking whether blocks are prone to fail.

DETAILED DESCRIPTION

Technology is described herein for identifying at-risk data in a non-volatile storage system and re-programming that data to a safer location. In one embodiment, the system can predict which blocks (or other units of storage) will become bad based on performance data. Data in those blocks predicted to become bad can be programmed to other blocks, and the blocks predicted to become bad can be removed from further use.

Figure 1:
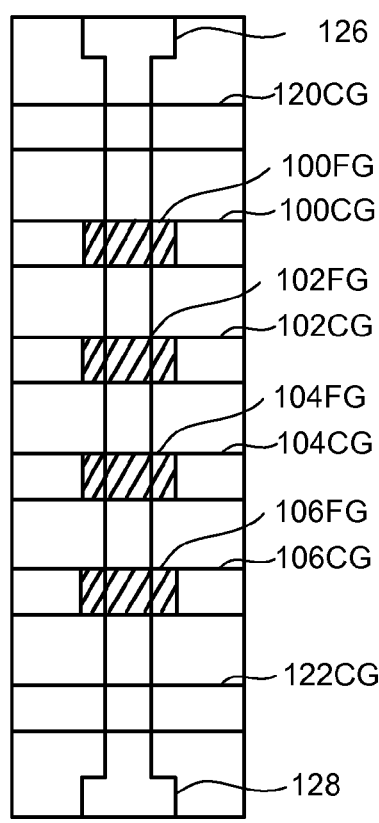
FIG. 1 is a top view of a NAND string.
Figure 2:
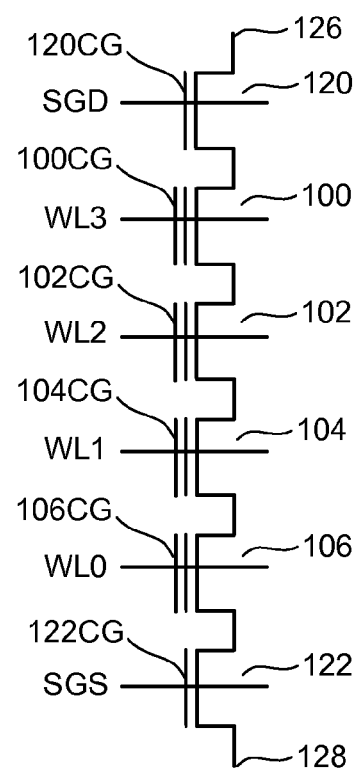
FIG. 2 is an equivalent circuit diagram of the NAND string.

One example of a non-volatile storage system that can implement the technology described herein is NAND flash memory; however, other types on non-volatile storage can also be used. NAND flash memory includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first (drain side) select gate 120 and a second (source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four memory cells is only provided as an example. A NAND string can have less than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND structure will include several NAND strings. Each NAND string is connected to the common source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to a sense amplifier. Relevant examples of NAND type flash memories and their operation are provided in the following U.S. patents/Patent Applications, all of which are incorporated herein by reference: U.S. Pat. No. 5,570,315; U.S. Pat. No. 5,774,397; U.S. Pat. No. 6,046,935; U.S. Pat. No. 6,456,528; and U.S. Pat. Publication No. US2003/0002348.

Other types of non-volatile storage devices, in addition to NAND flash memory, can also be used, including other types of flash memory (e.g., NOR) as well as non-volatile storage that is not flash memory. For example, non-volatile memory devices are also manufactured from memory cells that use a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. U.S. Pat. Nos. 5,768,192 and 6,011,725 disclose a non-volatile memory cell having a trapping dielectric sandwiched between two silicon dioxide layers. Multi-state data storage is implemented by separately reading the binary states of the spatially separated charge storage regions within the dielectric. Non-volatile storage based on MONOS or TANOS types of structures or nanocrystals can also be used. Other types of non-volatile storage can also be used.

Figure 3:
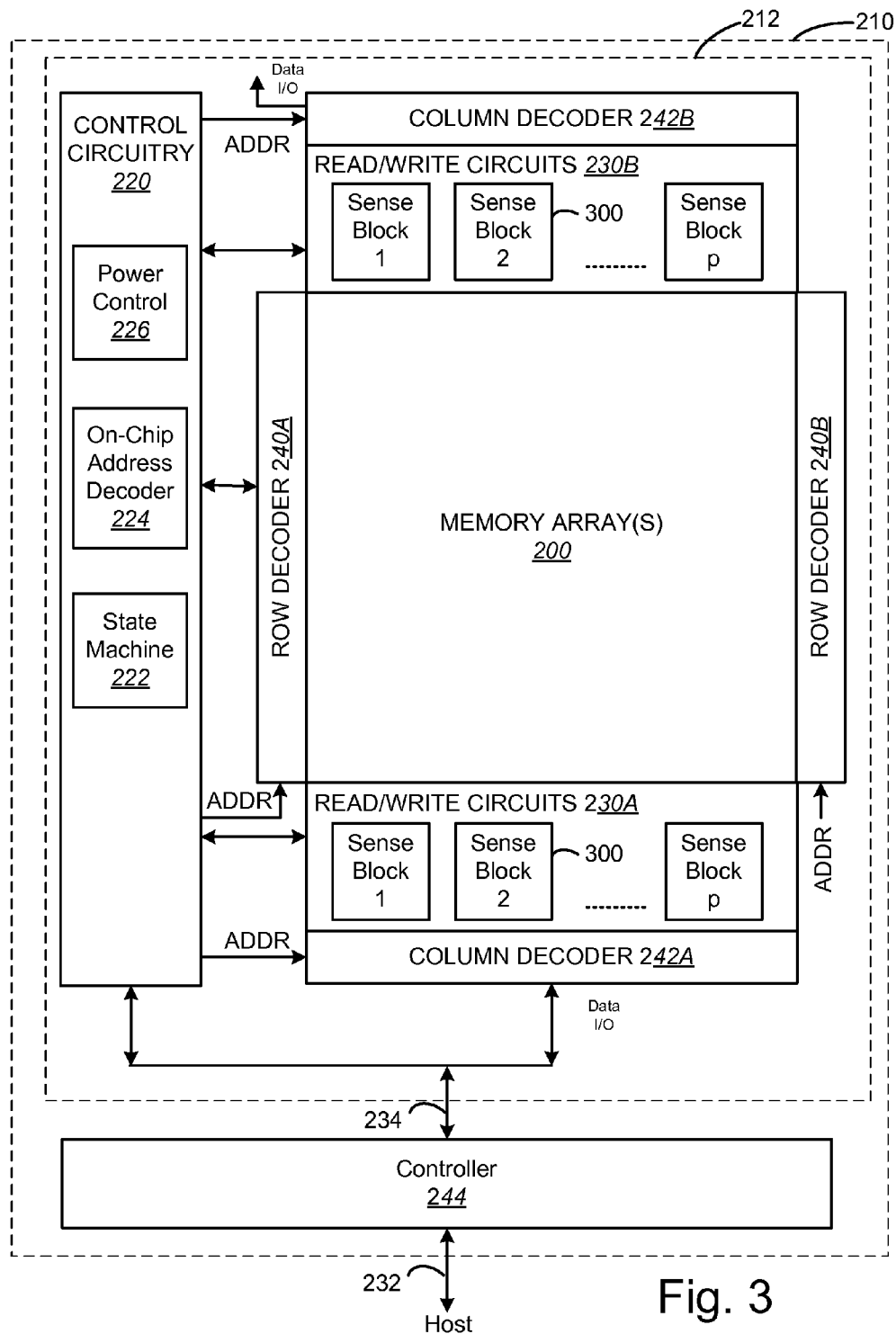
FIG. 3 is a block diagram of a non-volatile memory system.

FIG. 3 illustrates a memory device 210 having read/write circuits for reading and programming a page, a word line or other unit of memory cells (e.g., NAND multi-state flash memory) in parallel. Memory device 210 may include one or more memory die or chips 212. Memory die/chip 212 includes one or more arrays (two-dimensional or three dimensional) of memory cells 200, control circuitry 220, and read/write circuits 230A and 230B. In one embodiment, access to a memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. Word lines and bit lines are examples of control lines. In a typical embodiment, a controller 244 is included in the same memory device 210 (e.g., a removable storage card or package) as the one or more memory die/chips 212. Commands and data are transferred between the host and controller 244 via lines 232 and between the controller and the one or more memory die 212 via lines 234.

In one embodiment, memory chip 212 include only one memory array 200. In other embodiments, memory chip 212 includes multiple memory arrays 200. In some implementations that use multiple memory arrays, each memory array serves as a plane, with its own set of peripheral circuitry (e.g., decoders, drivers, etc.). In one example, there are two planes (two arrays) side-by-side on the same memory chip 212, with associated peripheral circuitry around each array so that memory operations can be performed concurrently on both arrays. That is, each memory array will have row decoders on both sides, column decoders on top and bottom, and Read/Write circuits on top and bottom.

Control circuitry 220 cooperates with the read/write circuits 230A and 230B to perform memory operations on the memory array 200. The control circuitry 220 includes a state machine 222, an on-chip address decoder 224, and a power control module 226. State machine 222 provides chip-level control of memory operations. On-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage. Control circuitry 220 provides address lines ADDR to row decoders 240A and 204B, as well as column decoders 242A and 242B. Column decoders 242A and 242B provide data to controller 244 via the signal lines marked Data I/O.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits. The one or more managing circuits perform the processes described herein.

Figure 4:
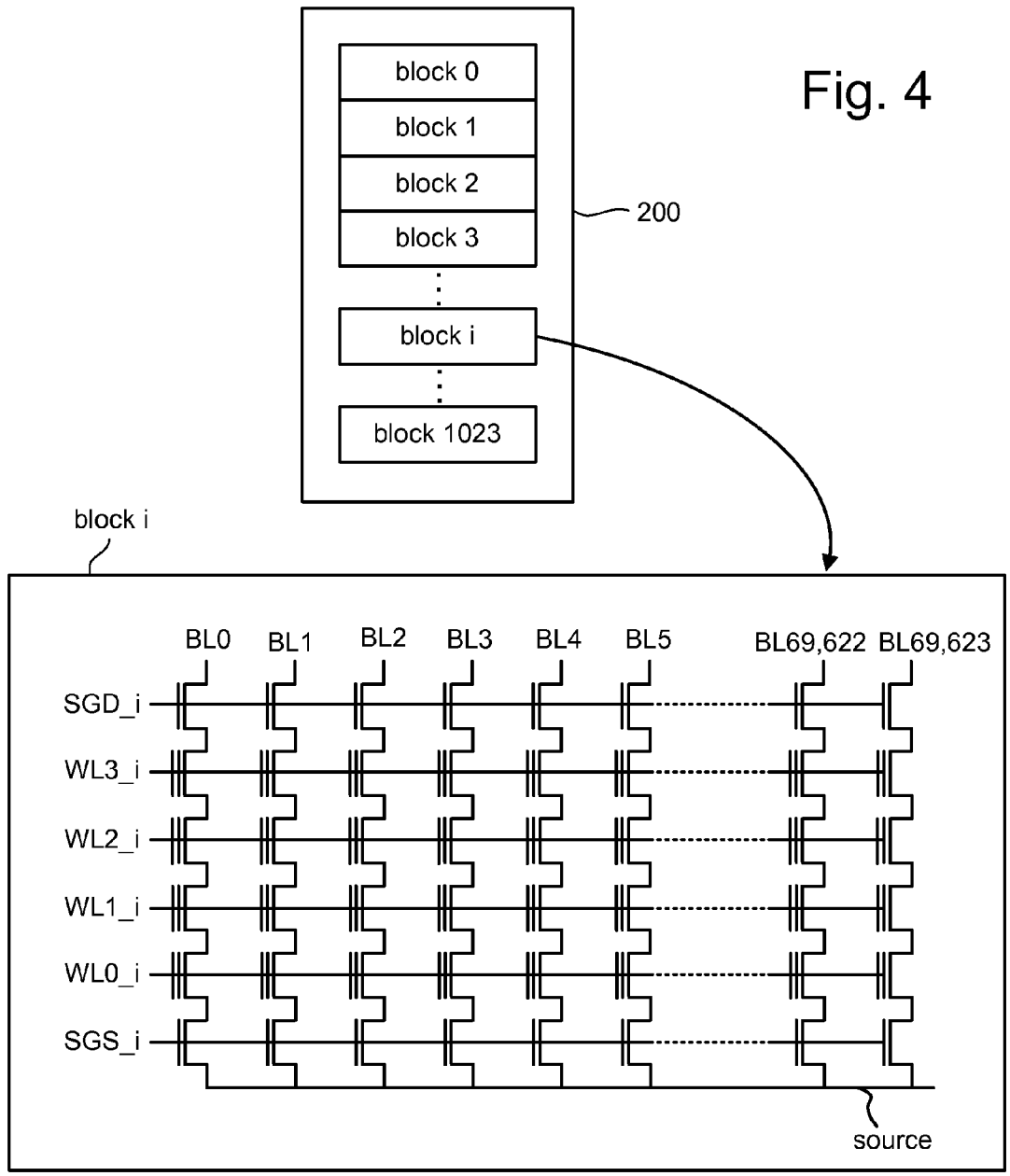
FIG. 4 is a block diagram depicting one embodiment of a memory array.

FIG. 4 depicts an exemplary structure of a memory array 200. In one embodiment, the array of memory cells is divided into a large number of blocks of memory cells. As is common for flash memory systems, the block is the unit of erase. That is, each block contains the minimum number of memory cells that are erased together. Other units of erase can also be used.

A block contains a set of NAND strings which are accessed via bit lines (e.g., bit lines BL0-BL69,623) and word lines (WL0, WL1, WL2, WL3). FIG. 4 shows four memory cells connected in series to form a NAND string. Although four cells are shown to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS).

Each block is typically divided into a number of pages. In one embodiment, a page is a unit of programming. Other units of programming can also be used. One or more pages of data are typically stored in one row of memory cells. For example, one or more pages of data may be stored in memory cells connected to a common word line. A page can store one or more sectors. A sector includes user data and overhead data (also called system data). Overhead data typically includes header information and Error Correction Code (ECC) redundancy that have been calculated from the user data of the sector. Controller 244 (or other component) calculates the ECC bytes when data is being programmed into the array, and also uses the ECC bytes to detect and/or correct errors read in the user data when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. Different sized blocks, pages and sectors can also be used. Additionally, a block can have more or less than 69,624 bit lines.

Figure 5:
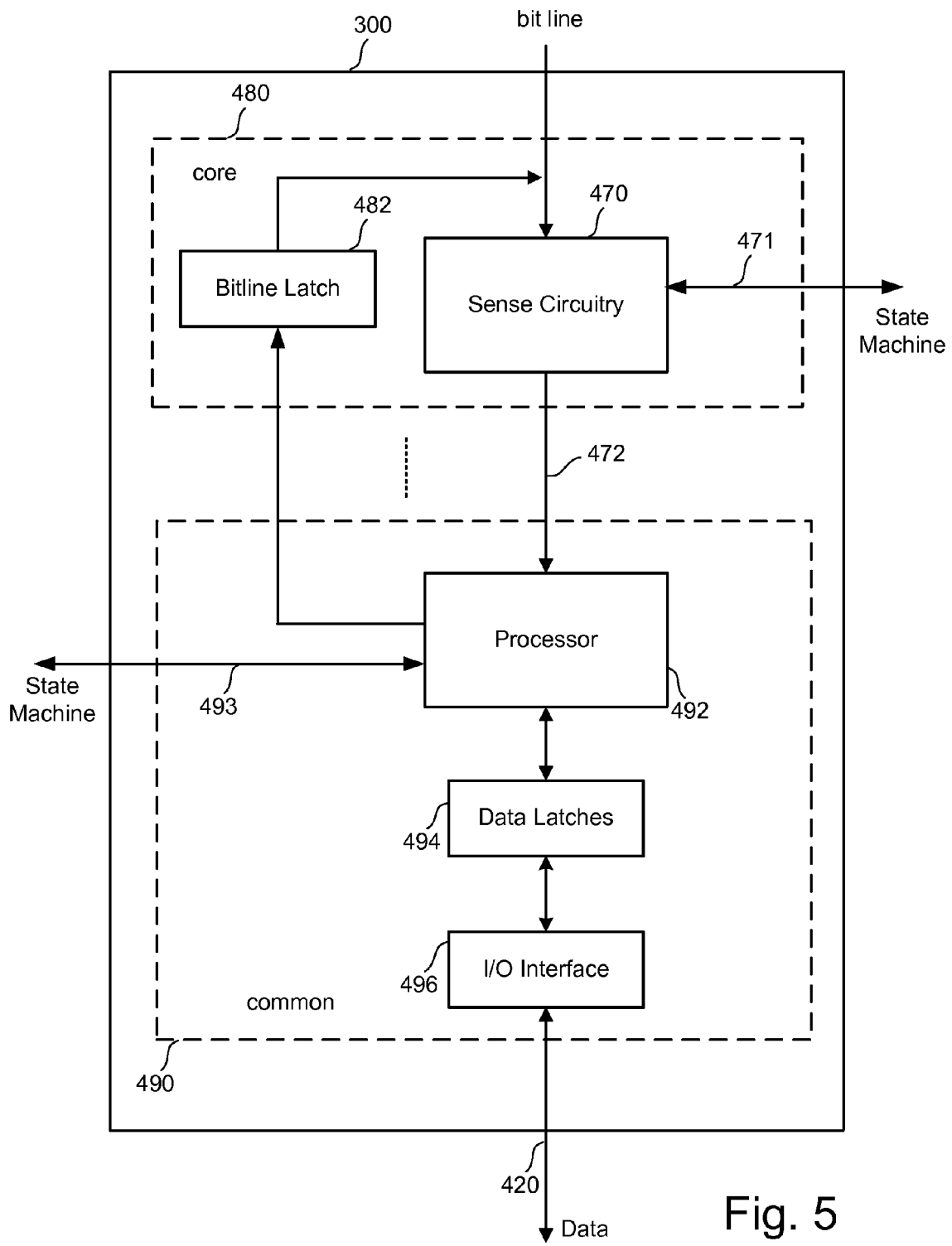
FIG. 5 is a block diagram depicting one embodiment of a sense block.

FIG. 5 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. One example can be found in U.S. Patent Application Publication 2006/0140007, which is incorporated herein by reference in its entirety.

Sense module 480 comprises sense circuitry 470 that determines whether a conduction current in a connected bit line is above or below a predetermined level. In some embodiments, sense circuitry 470 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd) in order to lock out memory cells from programming.

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data intended to be programmed into the memory. I/O interface 496 provides an interface between data latches 494 and the data bus 420.

During read or sensing, the operation of the system is under the control of state machine 222 that controls (using power control 226) the supply of different control gate voltages to the addressed memory cell(s). As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 5) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time. In another embodiment the processor 492 counts the number of '1' and in case they are smaller than some predefined small threshold then the programming operation is declared successful. That threshold is sometimes called the 'ignore bit number'.

Data latch stack 494 contains a stack of data latches corresponding to the sense module. In one embodiment, there are three (or four or another number of) data latches per sense module 480. In one embodiment, the latches are each one bit.

During program or verify, the data to be programmed is stored in the set of data latches 494 from the data bus 420. During the verify process, Processor 492 monitors the verified memory state relative to the desired memory state. When the two are in agreement, processor 492 sets the bit line latch 482 so as to cause the bit line to be pulled to a state designating program inhibit. This inhibits the memory cell coupled to the bit line from further programming even if it is subjected to programming pulses on its control gate. In other embodiments the processor initially loads the bit line latch 482 and the sense circuitry sets it to an inhibit value during the verify process.

In some implementations (but not required), the data latches are implemented as a shift register so that the parallel data stored therein is converted to serial data for data bus 420, and vice versa. In one preferred embodiment, all the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the sensing operations and sense amplifiers can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. Patent Application Pub. No. 20050169082; (4) U.S. Patent Application Publication 2006/0221692, titled "Compensating for Coupling During Read Operations of Non-Volatile Memory," Inventor Jian Chen, filed on Apr. 5, 2005; and (5) U.S. Patent Application Publication No. 2006/0158947, titled "Reference Sense Amplifier For Non-Volatile Memory," Inventors Siu Lung Chan and Raul-Adrian Cernea, filed on Dec. 28, 2005. All five of the immediately above-listed patent documents are incorporated herein by reference in their entirety.

Figure 6:
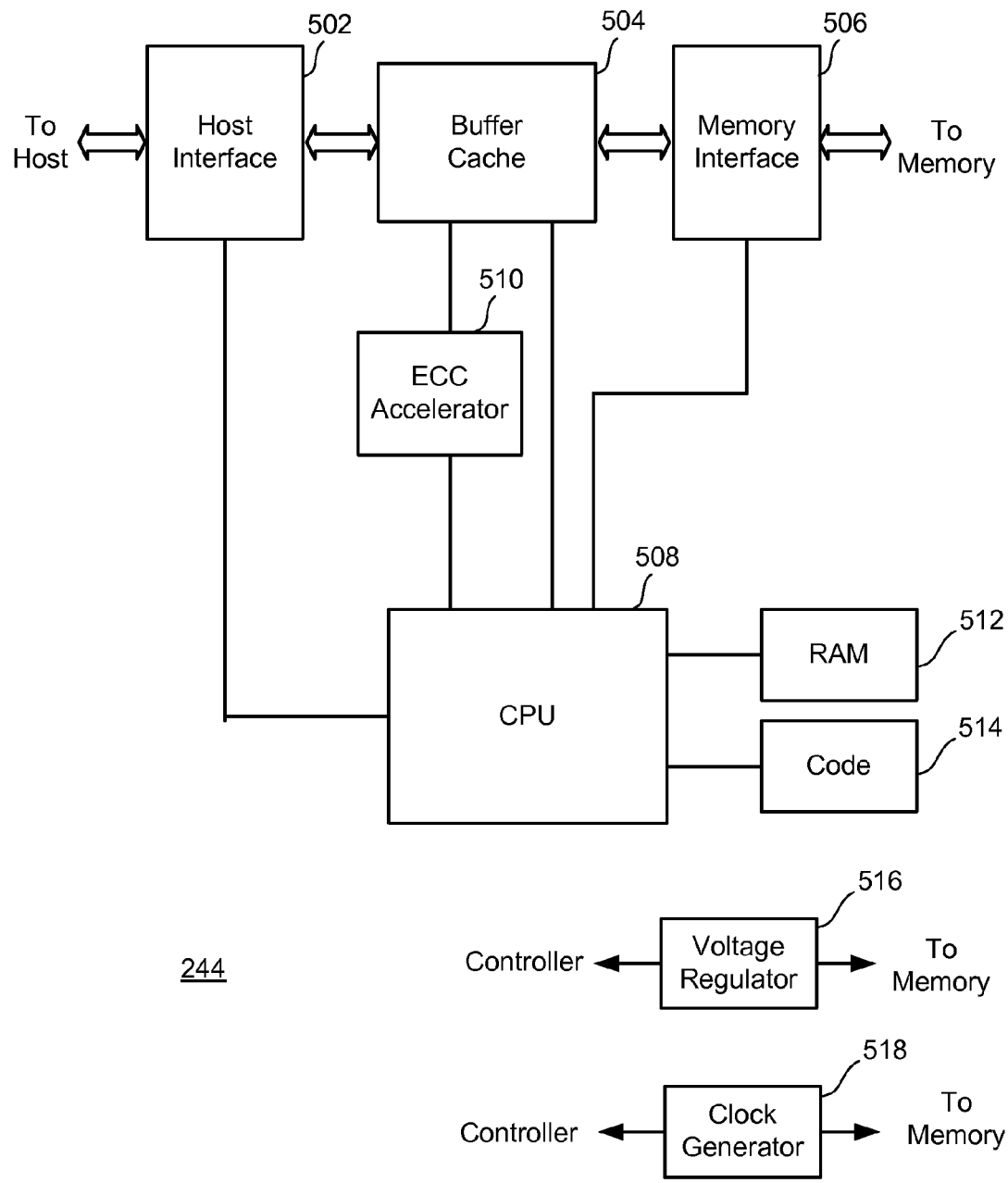
FIG. 6 is a block diagram of one embodiment of a controller.

FIG. 6 is a block diagram of one embodiment of controller 244. Other architectures can also be used. FIG. 6 shows host interface 502 which receives data and commands from the host (e.g., digital camera, cellular telephone, PDA, computer, etc.). Host interface 502 can also provide data and status to the host. In one embodiment, host interface 502 includes various circuits for receiving and providing information to the host. In some implementations, host interface 502 includes a processor and software for programming that processor. Host interface 502 is connected to buffer cache 504. Data received from the host by host interface 502 is transferred from host interface 502 to buffer cache 504 for storage in buffer cache 504. Buffer cache 504 is connected to memory interface 506. From buffer cache 504, data is provided to memory interface 506, which provides an interface for communicating data and commands to memory chip 212 (of FIG. 3) and for receiving data and status from memory chip 212 (of FIG. 3). Data received from memory chip 212 (of FIG. 3) at memory interface 506 is then stored in buffer cache 504 for transmission to the host via host interface 502. Memory interface 506 includes one or more circuits. In some embodiments, the memory interface can include a processor and software for programming that processor.

Controller 244 includes CPU 508, which can be any processor known in the art. CPU 508 is in communication with host interface 502, buffer cache 504, memory interface 506, ECC accelerator 510, RAM 512 and code store 514. ECC accelerator 510 includes one or more circuits for assisting CPU 508 in computing error correction redundancy for the data to be stored in memory or use the redundancy read from the memory to correct errors in the data read from the memory. In some embodiments, the data is stored in buffer cache 504 when ECC accelerator 510 is calculating error correction redundancy. ECC accelerator 510 can read the data from buffer cache 504 and store the error correction redundancy in buffer cache 504. In one embodiment, ECC accelerator 510 can include a processor and software for implementing said computation. Some implementations of ECC accelerator 510 will perform all the error correction related calculations, while in other embodiments, ECC accelerator 510 will assist CPU 508 in calculating related to error correction procedures. The raw data is read in from the host interface, error correction redundancy is added to the data and the data with the redundancy can be stored in buffer cache 504 for eventual storage in the memory chip.

RAM 512 serves as memory for CPU 508. Code store 514 includes firmware for operating CPU 508. Controller 244 also includes a voltage regulator 516 for providing a stable voltage to the components of controller 244 and the memory chip 212 (of FIG. 3). Clock generator 518 also provides a stable clock to the components of controller 244 (of FIG. 3) and memory chip 212 (of FIG. 3).

Figure 7:
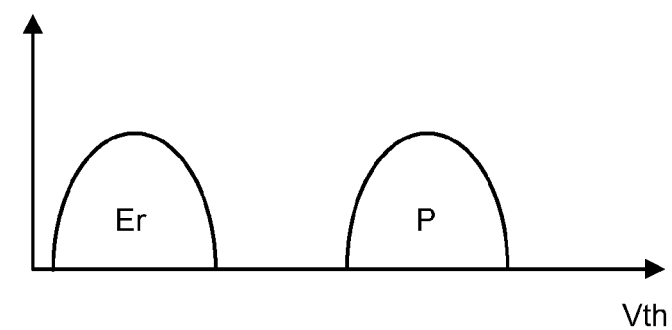
FIG. 7 depicts threshold voltage distributions of memory cells.

In one embodiment, the memory cells of memory array(s) 200 (of FIG. 3) store data as binary data. That is, one bit of data can be stored in each memory cell and each memory cell is charged such that when read it's threshold voltage corresponds to one of two threshold voltage distributions. For example, FIG. 7 shows two threshold voltage distributions: one threshold voltage distribution Er associated with memory cells that have been erased and a second threshold voltage distribution P associated with memory cells that have been programmed. In one embodiment, those memory cells in threshold voltage distribution Er store data "1" and those memory cells in threshold voltage distribution P store data "0." When a memory array is erased, all memory cells (except cells attributed to bad columns) will be in distribution Er. When data is to be stored in the memory array, some of the memory cells will be programmed to distribution P. In some embodiments, distribution Er is below zero volts and distribution P is above zero volts.

In other embodiments, the memory cells of memory array(s) 200 (of FIG. 3) will store multiple bits in each memory cell. For example, memory cells can store two bits per memory cell, three bits per memory cell, four bits per memory cell, etc. No specific number of bits per memory cell or encoding of data in these bits is required for the technology described herein. For example purposes only, the discussion below will explain an embodiment which uses four bits per memory cell. However, other embodiments will use different number of bits per memory cell.

A system that uses four bits per memory cell will utilize sixteen threshold voltage distributions corresponding to sixteen possible data states. For purposes of this document, data states and threshold voltage distributions will be used interchangeably. For the system that has sixteen data states, the data states will be labeled 0-9 and A-F. State 0 corresponds to the threshold voltage distribution for erased memory cells. Therefore, when all the memory cells of a population are erased, all the memory cells are in state 0. After memory cells are erased, they can be programmed from state 0 to any of the other 15 states. The table below provides one example of an encoding of data into the sixteen states. In one embodiment, each bit of data is associated with a separate page so that each memory cell stores data in four pages.

| State | 1st Page Data | $2^{nd}$ Page Data | $3^{rd}$ Page Data | $4^{th}$ Page Data |
|---|---|---|---|---|
| 0 | 1 | 1 | 1 | 1 |
| 1 | 1 | 1 | 1 | 0 |
| 2 | 1 | 1 | 0 | 1 |
| 3 | 1 | 1 | 0 | 0 |
| 4 | 1 | 0 | 1 | 1 |
| 5 | 1 | 0 | 1 | 0 |
| 6 | 1 | 0 | 0 | 1 |
| 7 | 1 | 0 | 0 | 0 |
| 8 | 0 | 1 | 1 | 1 |
| 9 | 0 | 1 | 1 | 0 |
| A | 0 | 1 | 0 | 1 |
| B | 0 | 1 | 0 | 0 |
| C | 0 | 0 | 1 | 1 |
| D | 0 | 0 | 1 | 0 |
| E | 0 | 0 | 0 | 1 |
| F | 0 | 0 | 0 | 0 |

There are many other suitable schemes for encoding data. For example, U.S. Pat. No. 6,222,762 and U.S. Patent Application Publication No. 2004/0255090, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. In some embodiments, the data encoding scheme can be changed for different word lines, different bit lines, different groups of bit lines, and different blocks. The data encoding scheme can be changed over time, or the data bits for random word lines may be inverted or otherwise randomized to reduce data pattern sensitivity and even wear on the memory cells.

There are many different programming processes currently known in the art that can be used with the technology described herein. That is, the technology described herein is not limited to any one particular programming process and many different programming processes, including ones not yet developed, can be used with the technology described herein. In one embodiment, a three-pass programming process is used to program memory cells connected to a common word line (referred to as the selected word line). The memory cells all start in the erased state. In the first pass of the programming process, memory cells are programmed from the erased state to three intermediate states. This is shown graphically in FIG. 8A. As can be seen, memory cells in state 0 are programmed to states I1, I2 and I3. Because a large amount of memory cells are programmed out of state 0, the height of state 0 is reduced from the dashed line to the solid line. State 0 is also widened due to programming on the same word line.

Those memory cells that will eventually be programmed to states 0, 1, 2 or 3 will remain at state 0 during the first pass of programming. Those memory cells that are to be programmed to states 4, 5, 6 and 7 will be programmed to state I1 in the first pass of the programming process. Those memory cells to be programmed to states 8, 9, A and B will be programmed to state I2 during the first pass of programming. Those memory cells to be programmed to states C, D, E and F will be programmed to state I3 during the first pass of programming.

In one embodiment, each of the three passes of programming can be performed consecutively, without interruption. In another embodiment, between passes of the programming process, memory cells on one or more other word lines can receive programming. Such a scheme can reduce coupling between neighboring memory cells. When memory cells on neighboring word lines receive programming, the neighboring memory cells will couple to the memory cells programmed in the first pass of programming. This coupling will raise the apparent threshold voltage of the memory cells on the selected word line, which will cause each of the states (0, I1, I2 and I3) to widen. FIG. 8B shows this widening, with the original states in dashed lines and the resulting widened states in solid lines. The widening will be corrected in future passes.

The second pass of the programming process will be performed based on the widened states of FIG. 8B. FIG. 8C graphically depicts the second pass of the programming process, showing the starting distributions in dashed lines and the new distribution in solid lines. From state 0, those memory cells intended for state 1 will be programmed to state 1, those memory cells intended for state 2 will be programmed to state 2, and those memory cells intended for state 3 will be programmed for state 3. Those memory cells that were in state 0 and are intended to remain in state 0, will remain in state 0. In some embodiments, state 0 will be widened due to programming on the same word line. Because the number of memory cells in state 0 have been reduced, the height of threshold voltage distribution for state 0 will be reduced. From intermediate state I1, those memory cells intended for state 4 will be programmed to state 4, those memory cells intended for state 5 will be programmed to state 5, those memory cells intended for state 6 will be programmed to state 6, and those memory cells intended for state 7 will be programmed to state 7. The heights of threshold voltage distributions is decreased since memory cells are being programmed from one threshold voltage distribution to three/four. From intermediate state I2, those memory cells intended for state 8 will be programmed to state 8, those memory cells intended for state 9 will be programmed to state 9, those memory cells intended for state A will be programmed to state A, and those memory cells intended for state B will be programmed to state B. From intermediate state I3, those memory cells intended for state C will be programmed to state C, those memory cells intended for state D will be programmed to state D, those memory cells intended for state E will be programmed to state E, and those memory cells intended for state F will be programmed to state F.

After the second pass of the programming process is performed for the selected word line, memory cells on other word lines nearby can receive the first, second and third passes of programming which causes coupling to the current memory cells being programmed on the selected word line. This coupling causes the apparent threshold voltage of some or more of the memory cells to be raised such that the threshold voltage distributions are widened, as depicted in FIG. 8D with the original distributions in dotted lines and the resulting widened distributions in solid lines.

To account for the widening of the threshold voltage distributions due to coupling, the third programming pass is used to narrow the threshold voltage distributions. The third pass of programming is depicted in FIG. 8E, which shows each of the states 1-F being narrowed. As can be seen in FIG. 8E, the original threshold voltage distribution is shown in dotted lines and the narrow threshold voltage distribution is shown in the solid line. Again, the programming of the same WL also widens the erase state. Note that state 0 is not narrowed. When the threshold voltage distributions are narrowed, the threshold voltage for the memory cells in the data state are raised in order to narrow the threshold voltage distributions. Because other neighboring memory cells may receive additional programming after the third programming pass, each of the threshold voltage distributions of state 8E can be widened due to coupling from neighboring memory cells, as depicted in state 8F. The dotted lines in FIG. 8F depict the threshold voltage distributions before widening due to coupling and the solid lines represent the threshold voltage distributions after widening of the threshold voltage distributions due to coupling.

FIG. 9A shows the sixteen data states of the memory cells that store four bits of data per memory cell. In one embodiment, a controller will scramble the data for various memory cells so that the distribution of data among the sixteen states is evenly distributed, as depicted in FIG. 9A. That is, the data encoding in the table above will be used for some memory cells, while other memory cells will use different data encoding, in order to achieve a uniform distribution. In other embodiments, the data encoding will not be changed for different memory cells. In other embodiments, the data encoding will be scrambled to store a distribution that is not uniform.

FIGS. 9A and 9B can be used to illustrate the process for erasing memory cells. FIG. 9A shows threshold voltage distributions of memory cells prior to the erase process being performed, while FIG. 9B shows the threshold voltages of memory cells after being erased. The erase process changes the threshold voltage of memory cells programmed to states 1-F (depicted in FIG. 9A) so that the threshold voltage of erased memory cells are all within the erased threshold voltage distribution, depicted in FIG. 9B as threshold voltage distribution 0. The erased threshold voltage distribution of FIG. 9B corresponds to state 0. From the erased threshold voltage distribution of FIG. 9B, the memory cells can be programmed as per the process of FIGS. 8A-8F.

Memory cells are erased in one embodiment by raising the p-well to an erase voltage (e.g., 20 volts) for a sufficient period of time and grounding the word lines of a selected block while the source and bit lines are floating. In blocks that are not selected to be erased, word lines are floated. Due to capacitive coupling, the unselected word lines, bit lines, select gate lines, and the common source line are also raised to a significant fraction of the erase voltage thereby impeding erase on blocks that are not selected to be erased. In blocks that are selected to be erased, a strong electric field is applied to the tunnel oxide layers of selected memory cells and the selected memory cells are erased as electrons of the floating gates are emitted to the substrate side, typically by Fowler-Nordheim tunneling mechanism. As electrons are transferred from the floating gate to the p-well region, the threshold voltage of a selected cell is lowered. Erasing can be performed on the entire memory array, on individual blocks, or another unit of memory cells. One implementation of an erase process includes applying several erase pulses to the p-well and verifying between erase pulses whether the NAND strings are properly erased.

FIG. 10 is a flow chart describing one embodiment of a process for operating non-volatile memory, such as the system of FIG. 3 (or other systems). In step 600, a request to program data is received at controller 244 (of FIG. 3) from the host. The data to be programmed is also received. In response to the request, controller 244 will determine which block of flash memory cells will be used to store the data in step 602. The data will be programmed into the determined block using any of the programming processes described herein (or other programming processes) in step 604. The programmed data will be read one or many times in step 606 at the direction of controller 244. There is a dashed line between steps 604 and 606 because an unpredictable amount of time may pass between the steps, and step 606 is not performed in response to step 604. Rather, step 606 is performed in response to a request to read the data or other event.

FIG. 11 is a flow chart describing a programming process for programming memory cells in a block. The process of FIG. 11 is one embodiment of step 604 of FIG. 10. In step 632 of FIG. 11, memory cells are erased (in blocks or other units) prior to programming. For example, the threshold voltages are changed from the threshold voltage distributions of FIG. 9A to the single erased threshold voltage distribution of FIG. 9B. In step 634 of FIG. 11, soft programming is performed to narrow the threshold voltage distribution of the erased memory cells. Some memory cells may be in a deeper erased state than necessary as a result of the erase process. The soft programming process can apply programming pulses to move the threshold voltage of the deeper erased memory cells to a higher threshold voltage that is still in a valid range for the erased state. Since an entire block is erased in one operation then it is impossible to selectively inhibit cells from being erased deeper than they are, it is only possible to control if further erase pulses are sent and then check how many cells are still not erased in a block. This is what causing the wide distribution of erase state and the required soft programming to narrow it down. In step 636, the memory cells of the block are programmed as described herein. Steps 632-636 can be performed as instructed by the state machine, controller or combination of state machine and controller, using the various circuits described above. For example, controller 244 (of FIG. 3) may issue commands and data to the state machine to program the data. In response, the state machine may operate the circuits described above to carry out the programming operations. In step 638, controller 244 determines whether the one or more blocks just successfully written to are prone to fail. If so, controller 244 will manage the blocks prone to fail; for example, the data will be re-programmed to one or more new blocks and the blocks prone to fail will be marked as bad and hence will no longer be used. In one embodiment, the programming is done in the memory chip 212 as instructed by (or caused by) the controller 244.

Figure 12:
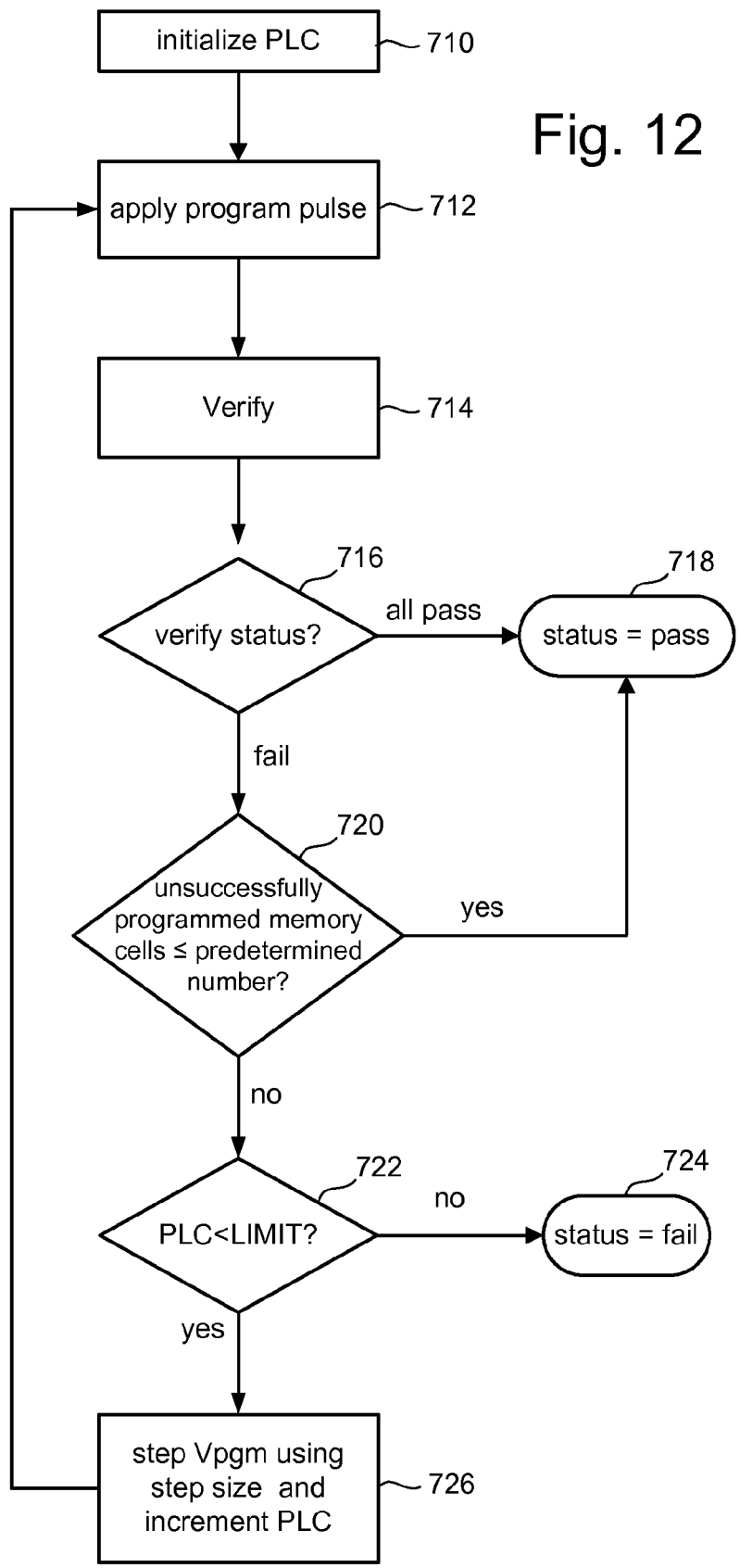
FIG. 12 is a flow chart describing one embodiment of a process for programming non-volatile memory elements.

FIG. 12 is a flow chart describing one embodiment of a process for performing programming on memory cells connected to a common word line. The process of FIG. 12 can be performed one or multiple times during each pass of the programming process of FIGS. 8A-F. In another embodiment after each pass, the Program Loop Counter (PLC) (see FIG. 12) is checked and if it exceeds some predefined limit, the block is marked as bad. This embodiment is less efficient since it allows for high PLC to be reached however, it is simpler for implementation since the flash circuitry 212 is left unchanged and only firmware in the controller 244 is modified.

Typically, the program voltage applied to the control gate during a program operation is applied as a series of program pulses. Between programming pulses a set of verify pulses are applied to enable verification. In many implementations, the magnitude of the program pulses is increased with each successive pulse by a predetermined step size. In step 710 of FIG. 12, the programming voltage (Vpgm) is initialized to the starting magnitude (e.g., ~12-16V or another suitable level) and a program loop count PLC maintained by state machine 222 is initialized at 1. In step 712, a program pulse of the program signal Vpgm is applied to the selected word line (the word line selected for programming). The unselected word lines receive one or more boosting voltages (e.g., ~9 volts or other magnitudes as are suited for the particular implementation) to perform boosting schemes known in the art. If a memory cell should be programmed, then the corresponding bit line is grounded. On the other hand, if the memory cell should remain at its current threshold voltage, then the corresponding bit line is connected to Vdd (e.g., ~3.5-5 volts) to inhibit programming. More information about boosting schemes can be found in U.S. Pat. No. 6,859,397 and U.S. Patent App. Pub. 2008/0123425, both of which are incorporated herein by reference. In step 712, the program pulse is concurrently applied to all memory cells connected to the selected word line so that all of the memory cells connected to the selected word line are programmed together. That is, they are programmed at the same time (or during overlapping times). In this manner all of the memory cells connected to the selected word line will concurrently have their threshold voltage change, unless they have been locked out from programming.

In step 714, the data states of the selected memory cells are verified using the appropriate set of target levels. Step 714 includes performing one or more verify operations. If it is detected that the threshold voltage of a selected memory cell has reached the appropriate target level, then the memory cell is locked out from further programming by, for example, raising its bit line voltage to Vdd during subsequent programming pulses. In step 716 it is checked whether all of memory cells have reached their target threshold voltages. If so, the programming process is successfully completed when all selected memory cells were programmed and verified to their target states. A status of "PASS" is reported in step 718. If not all memory cells have reached their target threshold voltage level (step 716), then in step 720 it is checked whether the number of memory cells that have not reached their target threshold voltage level is less than a predetermined number. This predetermined number can be equal to or less than the number of memory cells that can be corrected using error correction during the read process. If the number of memory cells which have not reached their target threshold voltage level is less than a predetermined number (step 720), then the programming process is complete and a status of "PASS" is reported in step 718. If the number of memory cells that have not reached their target threshold voltage level is greater than or equal to the predetermined number (step 720), then the programming process has not successfully finished, and the process continues at step 722.

In step 722, the program loop count PLC is checked against the program limit value (LIMIT). One example of a program limit value LIMIT is 40; however, other values can be used. If the program loop count PLC is not below the program limit value LIMIT (step 722), then the program process has failed, and a status of FAIL is reported in step 724. If, in step 722, it is determined that the program loop count PLC is below the program limit value LIMIT (step 722), then the process continues at step 726 during which time the program loop count PLC is incremented by 1 and the program voltage Vpgm is stepped up to the next magnitude. For example, the next pulse will have a magnitude greater than the previous pulse by a step size (for example a step size of 0.25 volts). After step 726, the process loops back to step 712, another program pulse is applied to the selected word line, and the process continues as discussed above. In some products, programming is achieved in multiple stages. Each stage consists of stair casing the program voltage up typically once, and sometimes twice in cases when programming the high states before programming the lower states. Each stage of programming may have one or two PLCs associated with that stage. Alternatively, it may be sufficient to keep track of loop counts in only one of the 3 stages. Also, one may choose to, for example, keep track of only $3^{rd}$ stage high states loop count. Alternatively, the $3^{rd}$ stage loop count can be defined as sum of the number pulses required to program the high states and the number of pulses required to program the low states.

The process of FIG. 12 is used to program multiple memory cells connected to the same word line. In one embodiment, a page is a unit of memory cells programmed concurrently. In one example, each word line includes one page. In another embodiment, each word line will include four pages, one page for each bit. The process of FIG. 12 can be used to program all memory cells connected to a word line or only those memory cells in a particular page. Looking back at the three-pass programming process of FIGS. 8A-F, the process of FIG. 12 can be performed once for each pass. In another embodiment, the process of FIG. 12 can be performed more than once for each pass. For example, the first pass (FIG. 8A) can use the process of FIG. 12 once to concurrently program to states I1, I2 and I3. Alternatively, the process of FIG. 12 can be used three times during the first pass, once for each state. In another embodiment, the process of FIG. 12 can be used to program state I3 first, followed by using the process of FIG. 12 to program states I1 and 2 (together or separately).

The second pass can include using the process of FIG. 12 to program to all 15 states concurrently. Alternatively, the process of FIG. 12 can be used a first time to program to states 1, 2, 3, 4 concurrently, the process of FIG. 12 can be used a second time to program to states 5, 6, 7, 8 concurrently, the process of FIG. 12 can be used a third time to program to states 8, 9, A, B concurrently and the process of FIG. 12 can be a fourth time to program to states C, D, E, F concurrently. In some embodiments, the higher states can be programmed before the lower states (C, D, E, F can be programmed first, or 8, 9, A, B, C, D, E, F can be programmed before states 1-7). In another embodiment, each state will be programmed separately using the process of FIG. 12.

The third pass of the programming process can also use the method of FIG. 12. In one embodiment, the method of FIG. 12 will be performed separately for each state. In another embodiment, all the states will be programmed concurrently using the process of FIG. 12. In another embodiment, the higher states are programmed first using the process of FIG. 12 followed by the lower states being programmed (C, D, E, F can be programmed first, or 8, 9, A, B, C, D, E, F can be programmed before states 1-7). Other variations can also be used.

Figures 13, 14:
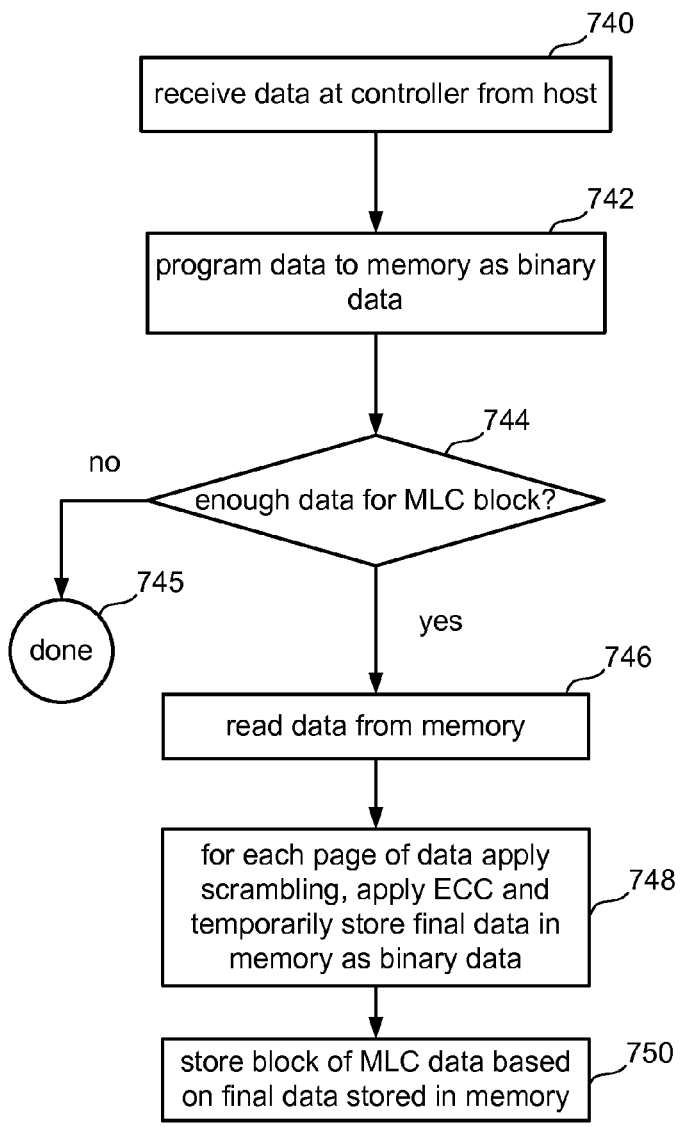
FIG. 13 is a chart that explains one example of an order of programming for a set of word lines.
FIG. 14 depicts is a flow chart describing one embodiment of a process performed when programming non-volatile memory elements.

As discussed above, between passes for the programming process, memory cells on neighboring word lines can also be programmed. FIG. 13 is a chart which describes one example of the order for programming word lines. As can be seen, word line 0 (the word line closest to the source line) is programmed first by receiving the first pass of the programming process, followed by word line 1 receiving the first pass of the programming process, followed by word line 0 receiving the second pass of the programming process, followed by word line 2 receiving the first pass of the programming process, etc.

In one embodiment, data is first stored as binary data. For example, controller 244 (of FIG. 3) will first store data for programming in buffer cache 504 (of FIG. 6). From buffer cache 504, the data will be stored as binary data in the memory array 200 (of FIG. 3). When enough data is stored in the memory array as binary data that can fill a full block of four bits per memory cell (e.g., there are four blocks of binary data), then the data is rewritten (folded) to a block in memory cell as four bits per memory cell. This process is described by FIG. 14. In step 740, data is received from the host at controller 244 (of FIG. 3). This data is stored in buffer cache 504 (of FIG. 6). Data from the buffer cache is then programmed into the memory array as binary data in step 742. If it is determined in step 744 that there is not enough data for a block of memory cells storing four bits per memory cell (or another amount of bits per cell), then the process of FIG. 14 is complete (step 745). If there is enough data for a block of memory cells storing four bits per data, then in step 746 the data for the new block will be read from the memory array in step 746 and stored in buffer cache 504 (of FIG. 6). In step 748, for each page of data, controller 244 (of FIG. 3) will calculate the error correction codes, add the error correction code[s] to the data and temporarily store all data (with ECC) as four pages of binary data back into the memory array and in buffer cache 504. In step 750, the four pages of binary data are programmed as one block of four bits per memory cell from the buffer cache 504 into the memory array 200 (of FIG. 3). The process of FIG. 14 can be used with other resolutions (e.g., two bits per cell, three bits per cell, etc.). Alternatively, in FIG. 14, writing the binary data in step 748 can be skipped while in step 750 the data can be directly written to a memory cell holding 4 bits in each cell, assuming scrambling and ECC redundant bits are already computed in step 742 or in step 750

As described above, during the programming process, the system will verify whether the threshold voltage has reached the target threshold voltage. After programming, the system can also read the threshold voltage, in order to read the data stored by the memory cell. In general, during the read and verify operations, the selected word line is connected to a voltage level which is specified for each read or verify operation in order to determine whether a threshold voltage for the concerned memory cell has reached such voltage level. After applying the voltage to the control gate of the word line, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than a certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of the memory cell is measured by the rate it discharges or charges a capacitor in the sense amplifier. In another example, the conduction current of the selected memory cell allows (or fails to allow) the NAND string that includes the memory cell to discharge a voltage on the bit line. The charge on the bit line is measured after a period of time to see whether it is discharged or not.

Figure 15:
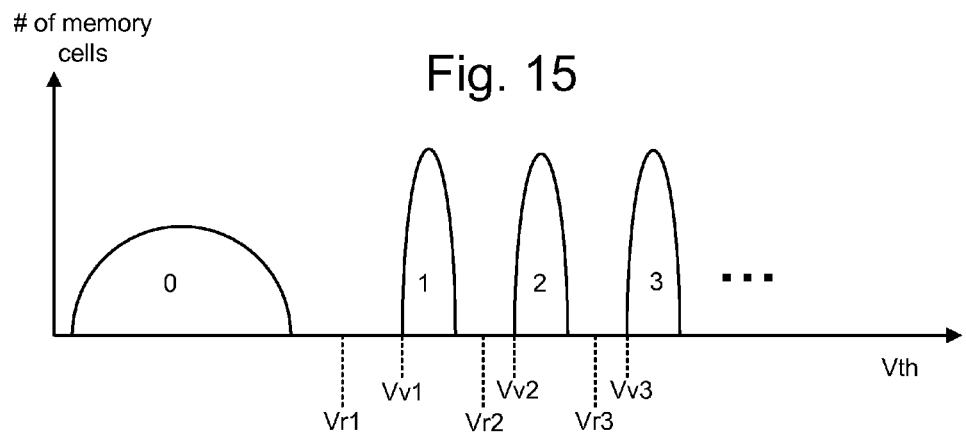
FIG. 15 depicts threshold voltage distributions of memory cells with read compare levels and verify compare levels.

As explained above, during read and verify operations, the control gate of the selected word line is applied a voltage which corresponds to the particular read and verify operation. That is, every data state that memory cells can be programmed to will have at least one read compare value and a verify compare value. The verify process uses the verify compare value to determine whether the appropriate memory cells have reached that particular data state. The read compare values are used in order to determine whether memory cells are in certain data states or not. FIG. 15 shows a portion of the threshold voltage distribution of FIG. 9A with read compare values and verify compare values. For example, between state 0 and state 1 is a read compare value Vr1. Between data states 1 and 2 is a read compare value Vr2. Between data states 2 and 3 is a read compare value Vr3. In the case of a memory cell holding 4 bits there is a read compare value between each of the data states (Vr1, Vr2, Vr3, Vr4 . . . Vr15). By testing, for example, whether memory cells conduct current when a word line receives Vr1, the system may determine whether the memory cells are in data state 0 or not. By determining whether the memory cells conduct current in response to Vr1 and Vr2 being applied to the word line, the system may determine whether the memory cells are in state 1. At the bottom edge of each threshold voltage distribution is a verify compare value. For example, at the bottom edge of data state 1 is Vv1, at the bottom edge of state 2 is verify compare value Vv2, at the bottom edge of data state 3 is verify compare value Vv3, etc. For example, a memory cell has been successfully programmed to state 2 when its threshold voltage is equal to or greater than Vv2.

Figure 16:
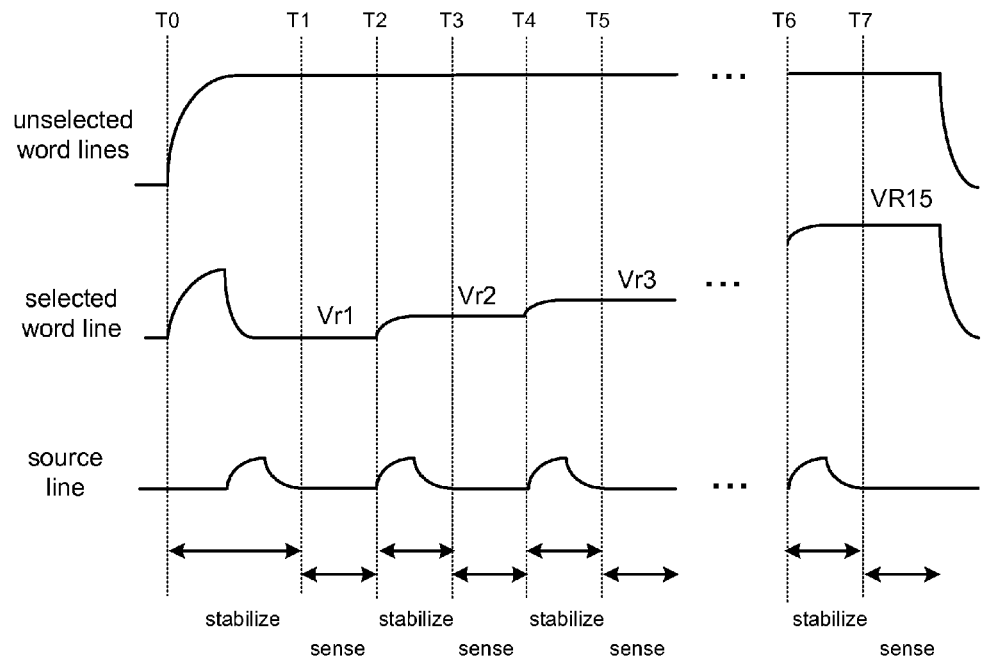
FIG. 16 is a timing diagram that explains a read process.

FIG. 16 is a timing diagram showing behavior of the unselected word lines, the selected word line and the source line during a read process. In this particular read process, the unselected word lines will be raised to an overdrive signal so that the unselected memory cells will be conducting. The selected word line will initially be ramped up in order to help the unselected word lines reach their target voltage. Subsequently, starting at T1, the selected word line will cycle through each of the read compare values (Vr1 . . . Vr15). The source line will be pulsed between readings so that the system will alternatively stabilize and then sense, stabilize, sense, stabilize, sense, . . . etc. In another embodiment, the selected word line will receive pulses for each of the read compare values and the unselected word lines will be raised up before each pulse and dissipated after each pulse. Other read processes known in the art can also be used. The technology described herein is not limited to any one particular type of read process.

Figure 17:
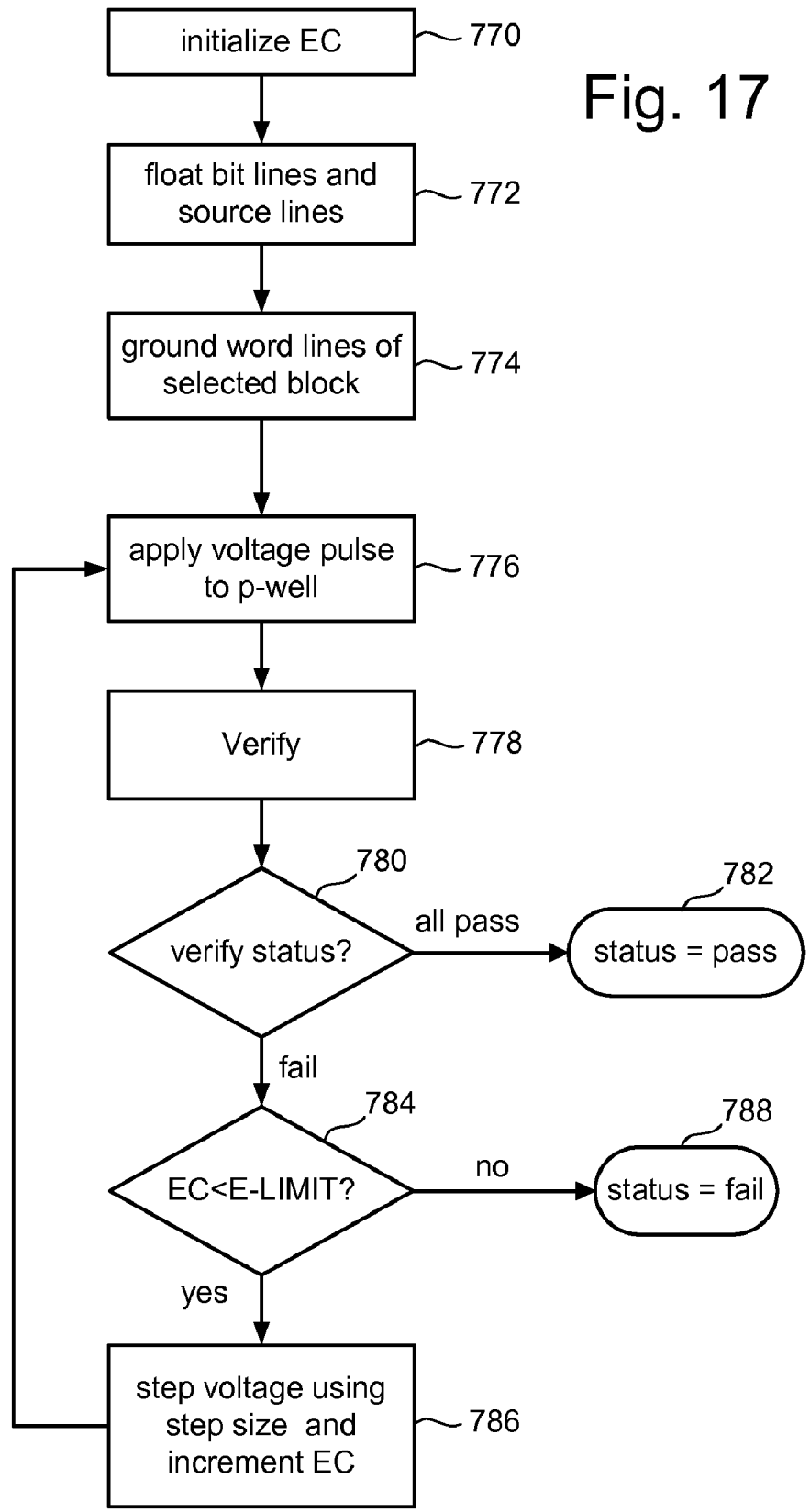
FIG. 17 is a flow chart describing one embodiment of a process for erasing non-volatile memory elements.

FIG. 17 is a flow chart describing one embodiment of an erase process. In general, the erase process includes applying erase pulses to the p-well of the memory array. In one embodiment, the memory cells are implemented on the surface of the p-well, the p-well is within an n-well and the n-well is in a p substrate. Between pulses, the system will verify whether the block is appropriately erased. Like the programming process, the system will keep a count of the number of pulses (erase loop). The number of erase loops is maintained by the erase count EC. In step 770 of FIG. 17, the erase counter EC is initialized to 1. In step 772, the bit lines and source lines are floated. In step 774, the word lines for the selected block are grounded and the word lines for unselected blocks are floated. In step 776, a voltage pulse is applied to the p-well. In one embodiment, the voltage pulse is 20 volts. In step 778, the system verifies whether the block is appropriately erased. In one embodiment, an erase verify voltage is applied to all the word lines and the system determines whether a minimum number of NAND strings for the block (all NAND strings or a number greater than a predetermined limit) conduct in response to the erase verify voltage. In one embodiment, when the erase threshold voltage distribution is completely below zero volts, the erase verify voltage applied to the word lines is 0 v. If all the NAND strings (or a predetermined minimum number of NAND strings) all pass the verify process (step 780), then the erase process is successfully complete (step 782). If less than the minimum number of NAND strings conduct in response to the erase verify voltage applied to the word lines, then the system determines whether the erase count EC is below an erase limit LIMIT in step 784. If the erase count EC is below the erase limit LIMIT, then in step 786 the system will step the magnitude of the voltage pulse by a step size and increment the erase count EC by one. After step 786, the process loops back to step 776 and applies another voltage pulse. In one embodiment, the voltage pulse will not be stepped and each iteration will include applying the same magnitude voltage pulse. In other embodiments, the width of the voltage pulse can be changed for each iteration. If the erase count EC is not below the erase limit LIMIT (step 784), then the erase process fails (step 788). One example of the erase limit LIMIT is 10. Note that, similar to programming, in some embodiments not all memory cells needs to pass the verify because there is some small number of memory cells that the system can ignore if the ECC is capable of correcting them later on. Such memory cells are called stuck cells.

As mentioned above, there are times when data is successfully programmed to a block and subsequently it is no longer possible to read that data due to a deterioration in the word line, memory cells or other portions of the memory. Technology is proposed to predict, after programming and receiving a status that the programming operation was successful, if the block just programmed to is prone to fail in the future. Thus, a prediction is made that a set of non-volatile storage elements are prone to fail, even though the set of non-volatile storage elements have not yet failed. If the block is prone to fail in the future, then the data stored in that block can be reprogrammed to another block since the data is still available in either buffer cache 504 (of FIG. 5) on the controller 244 (of FIG. 3) or a binary buffer on the memory chip 212 (of FIG. 3). In one embodiment, controller 244 performs a series of tests to look for behavior that is different than normal. Such a difference can be identified and used as an indication for failure prediction, even when the block is successfully programmed or erased.

In one set of embodiments, controller 244 (of FIG. 3) (or another component) will perform two phases of testing. During the first phase of testing, the controller will perform a test that can be completed quickly. If a block fails the test, that block will be considered a suspected block. Blocks that pass the test will not be marked as suspected blocks and will not undergo any more testing. Those blocks that are suspected blocks will undergo a second set of testing which is more rigorous and takes more time. Blocks that fail the second test will be considered bad blocks that are prone to failure. Data from those bad blocks will be reprogrammed elsewhere and the block will be marked as bad so that it will not be used in the future. Blocks that pass the second series of tests will be considered normal. This dual phase scheme helps maintain performance (programming throughput) by avoiding excessive time-consuming tests in real time during the life of the device on all the blocks, while on the other hand minimizing the misdetection of deteriorating blocks at the time they are still usable.

FIG. 18 is a flow chart describing a high level process of performing the two phases of tests to identify and manage blocks prone to failure. The process of FIG. 18, performed by the controller, is one example implementation of step 638 of FIG. 11. The process of FIG. 18 is performed after successfully completing the programming (and/or erasing) of the memory cells. In step 802, controller 244 (of FIG. 3) performs the first phase of testing. It is possible that controller 244 will do the testing or instruct memory chip 212 (of FIG. 3) to perform the testing. In step 804, it is determined whether the block passed or failed the test. If the block passed the test, then that block is not marked as a bad block (step 806) and the process of FIG. 18 is complete. If the block failed the test of step 802, then (in one embodiment) the block is marked as suspect and in step 808 a second phase of testing is performed on that block. Thus, in one embodiment, the second test is only performed for memory cells that failed the first test. The second phase of testing can be performed by the controller or it can be performed by memory chip 212 under the direction of the controller. In step 810, it is determined whether the block passed or failed the second phase of testing. If the block passed the second phase of testing, then the block is considered good and it not marked as a bad block in step 806. If the block failed the second phase of testing (step 808), then after step 810 the block is marked as bad in step 812. As discussed above, the first phase of testing (step 802) can be performed quickly, while the second phase of testing is a more in-depth test that takes more time. By only having a small subset of blocks be subjected to the second phase of testing, any performance penalty for this testing is reduced.

In one embodiment, controller 244 will maintain a table of block identifications and flags indicating whether the block is bad or not. This table can be stored in a portion of the memory array dedicated to store management data for the controller. Alternatively, this table can be stored in the controller. This data could also be stored in other non-volatile storage. The data is stored in non-volatile storage so that a power down does not result in loss of this data.

After marking a block as bad in step 812, controller 244 will reprogram the data to a new block. The data is likely to be in buffer cache 504 or stored as binary data in the memory array 200 (see step 742 or step 748 of FIG. 14). From any of those locations, the controller can direct the memory chip 212 to program the data into a new block that is not marked as bad. Programming may be done for example with any of the processes described above in FIGS. 10, 12, 14 and 17.

In step 816, controller 244 can count the number of bad blocks. In step 818, the thresholds used for the testing in steps 802 and 808 can be adjusted based on the number of bad blocks counted in step 816. For example, if the number of bad blocks becomes too high, then the controller 244 may raise the threshold for determining that a block failed a test. That is, as the number of available blocks becomes smaller, the controller wants to have a high confidence that a block is likely to fail before it takes it out of rotation for storing user data. In some embodiments, steps 816 and 818 are always performed. In other embodiments, steps 816 and 818 are only performed periodically, as opposed to every time the process of FIG. 18 is performed. Alternatively, steps 816 and 818 are performed separately from the process of FIG. 18. In some embodiments, steps 816 and 818 are not implemented.

As explained above with respect to FIG. 12, the programming process includes repeating a loop (multiple iterations). At each loop, the program loop count PLC is incremented. In one embodiment, the number of programming loops can be used as an indication that a block is deteriorating or otherwise prone to failure. Thus, in one embodiment, the first phase of testing will include looking at the program loop count PLC to determine whether the programming took too many loops to complete. In other embodiments, this test can also be used for the second phase of testing. FIG. 19 is a flow chart describing one embodiment of the process of using the program loop count PLC as the first phase of testing. That is, the process of FIG. 19 is one implementation of step 802 of FIG. 18. In one embodiment, the process of FIG. 19 is performed by or according to a command by controller 244.

In step 840 of FIG. 19, controller 244 obtains one or more program loop counts PLC for each word line (or other portion of the block). After programming is complete, the memory chip 212 will store the program loop count PLC for each word line in a latch, register or memory location associated with that word line. The controller can request the program loop count PLC by issuing a command to memory chip 212. In one embodiment, memory chip 212 will store a program loop count for each pass of the three pass programming technique and all three program loop counts will be sent to controller 244. In another embodiment, only an average of the three program loop counts will be sent for each word line. In another embodiment, the memory chip will only store the latest program loop count (e.g., the third pass of the three pass programming process). Therefore, only the latest program loop count will be transmitted to controller 244. In another embodiment, memory chip 212 will store a program loop count comprising the sum of the count of all programming passes. In some embodiments, the process of FIG. 12 can be performed multiple times for each pass. In those cases, the memory chip can also send the program loop count for the last performance of the process of FIG. 12 for the last pass. Alternatively, the memory chip 212 will send the program loop counts for every performance of the process of FIG. 12 for all passes, an average of all program loop counts, or some other subset.

Note that in some embodiments of flash memory systems, the flash does not keep the PLC per word line in the flash itself as part of the metadata of the word line. After each pass this number can be read by controller 224 from the flash. However, once a new programming pass is initiated (like the one in FIG. 12) the PLC is set to zero and any previous value[s] of the PLC is lost.

In some implementations, the system programs the high states prior to programming the lower states. For example, the process of FIG. 12 will be used in the third pass for programming the highest eight states and then the process of FIG. 12 will be used in the third pass for programming states 1-7. In some embodiments, both program loop counts for the third pass will be transmitted in step 840 for each word line. In other embodiments, only the program loop counts from the third pass for the high states will be transmitted, or only the program loop counts from the third pass for the low states will be transmitted.

In some embodiments where two planes are programmed concurrently, both program loop counts for corresponding word lines in the two planes can be sent from chip 212 (of FIG. 3) to controller 244 (of FIG. 3). In other embodiments with two planes being programmed concurrently, only the larger of the two program loop counts for corresponding word lines in the two planes are transmitted. Other variations of which program loop counts will be sent can also be used.

In step 842 of FIG. 19, controller 244 will calculate an average for the program loop counts PLC received. For example, in one embodiment, controller 244 will receive one program loop count (PLC) for each word line. These PLC's will be added and averaged to create an average program loop count for the entire block. In step 844, each PLC for each word line is compared to the average. In step 846, controller 244 will determine whether any one of the PLC's compared in step 844 is greater than the average by some constant K1 (e.g., is PLC>avg+K1?). One example of K1 is 6. If all the PLC's are less than or equal to (avg+K1), then the block has passed the first phase of testing (step 848). If any PLC is more than K1 loops greater than the average PLC, then the block has failed (Step 850). That failed block will be noted as being suspicious and the word line that caused the block to fail will be noted and stored in RAM 512 (of FIG. 6). In another embodiment, the PLC is compared against a constant, rather than an average, to determine if the first test fails.

One alternative to the process of FIG. 19 is to compare the erase count EC in a similar manner as PLC is used in FIG. 19 for program loop count. That is, as discussed above with respect to FIG. 17, the system can perform a number of iterations of the erase process. The number of iterations (the erase count EC) can be stored and compared to an average EC. A block with an EC greater than some predetermined number will be marked as suspicious. Alternatively, a block with an EC greater than the average of the EC for all blocks will be marked as suspicious. When using the process of FIG. 19 with EC, step 840 would include obtaining the EC for each block, step 842 would include calculating an average EC and step 844 would include comparing the one EC for the current block to the average EC. Then steps 846 and 850 would including EC instead of PC as well and usage of a different value for K1. Is step 850 we note the block that has larger average EC rather than the WL.

In another alternative if the PLC is greater than some predetermined number the average, or the EC is greater than some predetermined number or average, by more than a second constant (where the second constant is higher than the first constant K1), then the block can be considered bad without having to perform the second phase of testing.

One example of performing the second phase of testing includes reading the data back immediately after programming and comparing the data read to the desired correct bits that are still available in buffer cache 504. FIG. 20 is a flow chart describing such a process. In step 870, controller 244 (of FIG. 3) will request that the data be read from memory chip 212 (of FIG. 3). The controller can read the entire block, the entire word line or only a portion of a word line from memory chip 212. In one embodiment, controller 244 will only read the word line that failed the test of FIG. 19 (e.g., the word line that had PLC≦avg+K1). In another embodiment, controller 244 will only read a portion of the memory cells on the word line that failed the test of FIG. 19. In one example, the portion of memory cells read will be 25% of the memory cells connected to the word line that are the farthest away from the word line driver. In another embodiment, controller 244 will read the memory cells at the both ends of the word line so that the first and last 25% of the memory cells are read. Other subsets can also be read. In step 872, the data read in step 870 is compared to the data in buffer cache 504 (of FIG. 6). In step 874, controller 244 determines the number of errors in the data read from memory. If the number of errors is greater than a constant K2, then the block failed the test and is marked as bad. If the number of errors in the data read from the memory is less than or equal to K2, then the block passed the test. One example of K2 is 72 bits.

Figure 21:
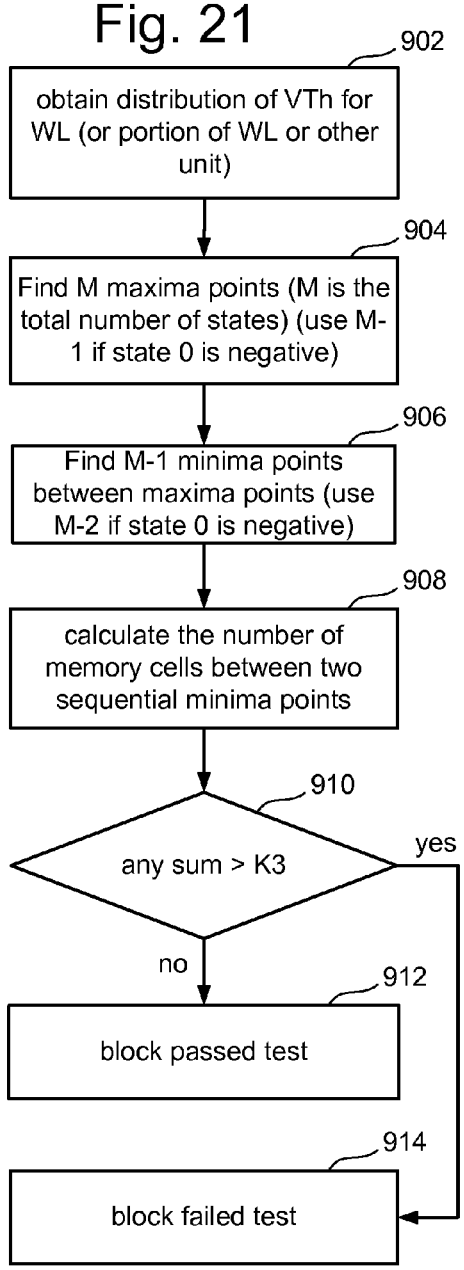
FIG. 21 is a flow chart describing one embodiment of a process for performing a test when checking whether blocks are prone to fail.

FIG. 21 is a flow chart describing another embodiment for performing the second phase of testing (step 808 of FIG. 18). In the process of FIG. 21, the system will determine the threshold voltage distribution for a population of memory cells and compare it to the expected threshold voltage distribution. If that threshold voltage distribution varies by a substantial amount from the expected threshold distribution, then controller 244 (of FIG. 3) will assume that the block is prone to failure. As discussed above, in some embodiments, controller 244 will scramble the data in order to have a uniform threshold voltage distribution (e.g., FIG. 9A) where there will be close to equal number of cells in each state. In that embodiment, the system will determine the number of cells in some or all the states, and if the number memory cells in any of the states that are being counted is beyond an expected safe zone range then the corresponding block is flagged as suspicious. If the count of cells in any one or subset of states deviate from expected safe zone by more than a predetermined amount, then the system will assume that the block is prone to failure. In step 902 of FIG. 21, controller 244 will obtain the distributions of threshold voltages for a word line (or a portion of a word line or other unit of memory cells). In one embodiment, memory chip 212 can have built in logic for obtaining the threshold voltage distribution automatically in response to a command by controller 244. The threshold voltage distribution of step 902 is obtained by performing read operations while applying a set of increasing voltage to the control gate of the selected word line. For example, the first read operation could be at a word line voltage of zero volts. Subsequent iterations can step by 0.05 volts, or other step sizes. For each read operation, the system will determine how many memory cells conducted during the read operation and did not conduct during the previous read operation. The resulting data should look something like FIG. 9A. In one embodiment, the threshold voltage distribution will only be determined for memory cells farthest from the word line drivers.

In step 904 of FIG. 21, controller 244 (of FIG. 3) will find M maximum points in the threshold voltage distribution, with M being the total number of data states. In one embodiment, the erase threshold voltage distribution is below zero volts; therefore, controller 244 will only find M−1 maximum points above zero volts. In step 906, controller 244 will find M−1 minimum points that are between the maximum points found in step 904. In the case where state 0 is negative, then M−1 is replaced by M−2. In step 908, controller 244 will calculate the number of memory cells between two sequential minimum points. Therefore, at the end of step 908, controller 244 knows approximately (since overlaps may occur between the distributions) how many memory cells are in each data state. If controller 244 chose to scramble the data to achieve uniform distributions, then the number of memory cells in each data state should be substantially equal to the total number of memory cells divided by the number of states. In one embodiment, one block of user data consists of about five million memory cells in an area defined by 64 usable word lines (plus two dummy word lines) and 65,536 bit lines for user data. The block also includes several thousand additional bit lines and NAND strings to hold extra bits used for error correction and other memory management purposes. In step 910, controller 244 determines whether any of the sums (the number of memory cells in each data state) is greater than a constant K3. In the embodiment discussed above with 65,536 bit lines and 16 states, the system will check to see whether any one data state has more than (65,536)×(1/16)+2Q memory cells, where Q is between 196 and 216 (depending on implementation). Other values for K3 can also be used, as are suitable for the particular implementation. If none of the data states has a sum of cells greater than K3, then the block passed the test (step 912). If any one of the data states has a number of cells greater than K3, the block fails the test (step 914). In another alternative, the process of FIG. 21 can be used as the first phase testing rather than the second phase testing.

Figure 22:
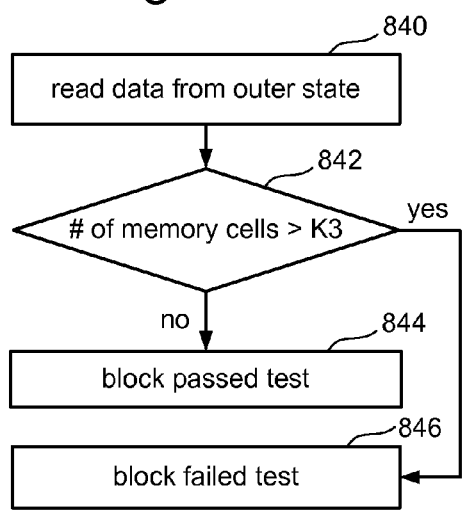
FIG. 22 is a flow chart describing one embodiment of a process for performing a test when checking whether blocks are prone to fail.

Obtaining the entire threshold voltage distribution and testing every data state could take a long time. A faster way to perform the second phase of testing is to look at only one data state or two data states (or another subset). If only attempting to read the number of memory cells in an outer data state (e.g., state 0 or state F for the example of FIG. 9), only one read operation needs to take place. For example, if controller 244 is only looking for the number of memory cells attributed to the erased state, a single read operation that applies Vr1 to the selected word line can be performed. If the controller 244 is only looking at state F, then a single read operation that applies Vr15 to the selected word line can be performed. FIG. 22 is a flow chart describing such an embodiment and is alternative for performing the first or second phase of testing. In step 840, controller 244 (of FIG. 3) will instruct memory chip 212 (of FIG. 3) to read data from one of the outer states (e.g., state 0 or state F, the outer states are the lowest and highest threshold voltage distributions) by performing a read operation that applies Vr1 or Vr15 to the selected word line. The number of memory cells in that particular data state will be sent to controller 244 from memory chip 212. In step 842, controller 244 will determine whether the number of memory cells in that outer state is greater than the constant K3. If not, the block passed the test (step 844). If the number of memory cells in the tested state is greater than K3, then the block failed the test (step 846). The controller can count the number of conducting cells (returning '0' from the read) for computing the number of cells in the highest state while counting the number of non conducting cells (returning '1' from the read) for obtaining the number of cells in Erase state when applying Vr1 to the WL.

In one embodiment, the system for predicting which blocks are prone to fail can be used with one or more memory arrays that store data in only two states (binary storage). In that case, step 840 can include reading how many bits are in the erased state or step 840 can include reading how many cells are in the highest programmed state or any subset of highest programmed states. For example, if the erased state includes threshold voltages below 0 v and the programmed state includes positive threshold voltages (or threshold voltages greater than P volts, where P is a positive number greater than 0), then step 840 can include applying 0 volts to the selected word line(s). An example for a consecutive subset of high programmed states would be to read at Vr13 and check for the number of cells in the 3 highest programming states assuming there are a total of 16 states. In this case, the expectation for the number of memory cells, if they are uniformly programmed using a scrambler, is equivalent to 3×K1.

Figure 23:
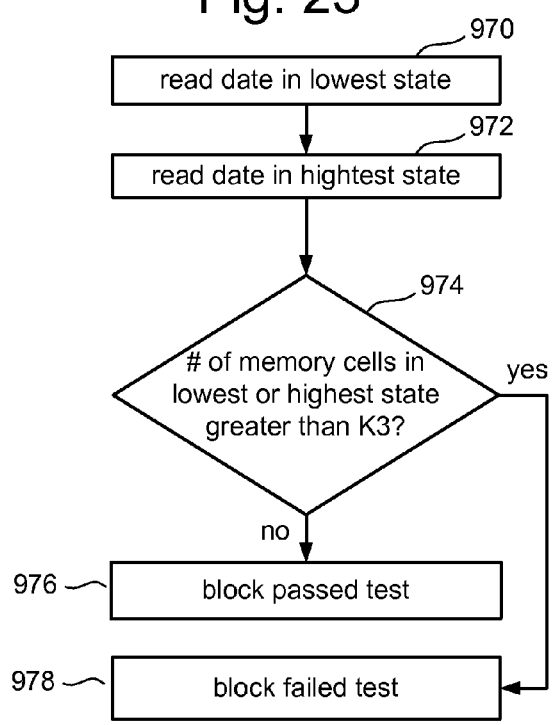
FIG. 23 is a flow chart describing one embodiment of a process for performing a test when checking whether blocks are prone to fail.

The process of FIG. 23, which is another embodiment of performing the first or second phase of testing, includes testing both the lowest and highest states. In step 970, controller 244 instructs memory chip 212 to read the number of memory cells in the lowest state (e.g., state 0). In step 972, controller 244 instructs the memory chip 212 to read the number of memory cells in the highest state (e.g., state F for FIG. 9 example). In step 974, controller 244 determines whether the number of memory cells in either the lowest state or the highest state is greater than K3. If not, the block passed the test (step 976). If the number of memory cells in either the highest or lowest state is greater than K3, then the block failed the test (step 978). In the embodiment where the memory arrays store data in only two states, the functions of steps 970 and 972 can be performed as one step since both functions can be accomplished by applying 0 volts to the selected word line(s). Another embodiment includes checking for each outer state if the number of memory cells attributed to it (according to the method described in FIG. 21) is below some threshold value K4. In case it is found to be below some threshold value K4, it is decided that the block failed the test. Another embodiment for the present invention is to check for each outer state if the number of cells attributed to it (according to the method described in FIG. 21) is within a safe zone e.g. above some threshold value K4 and below some threshold value K5. In case the number of cells is within the safe zone, then it is declared that the block passed the test, otherwise, it is decided that the block failed the test. Note that the lowest state and the highest state are the outer states mentioned with respect to FIG. 22. The difference between the process of FIG. 22 and the process of FIG. 23 is that the process of FIG. 22 only checks one of the outer states while the process of FIG. 23 checks both outer states.

Figure 24:
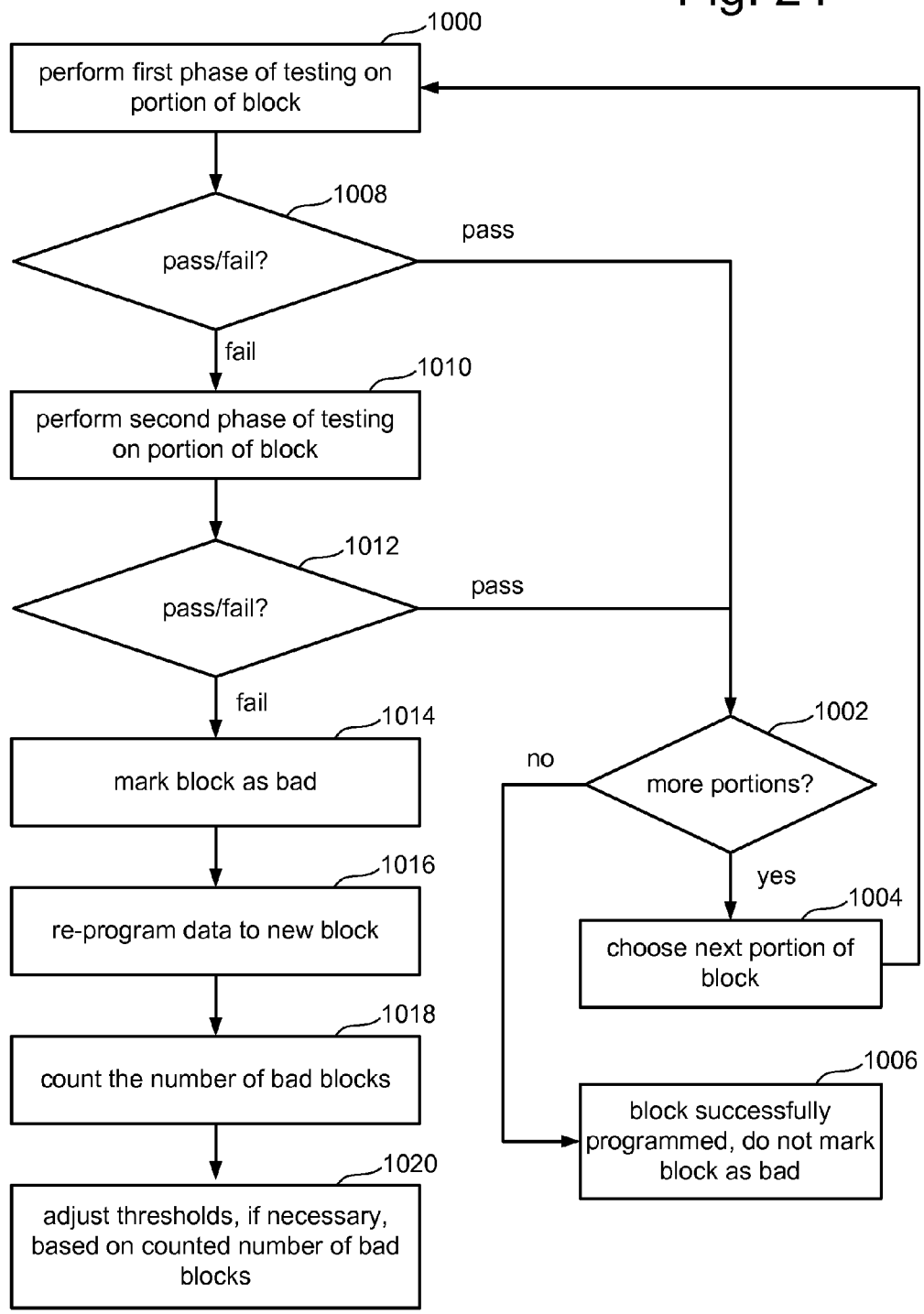
FIG. 24 is a flow chart describing one embodiment of a process for performing a test when checking whether blocks are prone to fail.

FIG. 24 is another embodiment for checking for blocks prone to failure and managing those blocks (step 638 of FIG. 11). One difference between the process of FIG. 24 and the process of FIG. 18 is that the process of FIG. 24 only operates on a portion of the block at a time while the process of FIG. 21 will operate on the entire block in each phase of testing. In step 1000, the first phase of testing is performed on a portion of the block. For example, the first phase of testing will be performed on only one word line. Other portions of the block can be used instead of one word line. In step 1008, it is determined whether the tested portion of the block passed or failed the test. If the portion of the block passed the test, then in step 1002 it is determined whether there are any more portions that still need to be tested. If not, the process of FIG. 24 is complete (step 1006), the block has been successfully programmed and the block does not need to be marked as bad. If there are more portions of the block to be tested, then a next portion of the block is chosen in step 1004 and the process loops back to step 1000 so that the first phase of testing is performed on a new portion of the block.

If the portion of the block fails the first phase of testing (step 1008), then the second phase of testing is performed on that portion of the block in step 1010. The processes of FIGS. 20-23 can be used as the second phase of testing in step 1010. If the portion of the block passes the second phase of testing (step 1012), then the process loops to step 1002 to consider additional portions of the block. If the portion of the block failed the test (step 1012), then the block is marked as bad in step 1014. No additional portions of the block need to be tested. In other embodiments, other portions of the block can be tested in order to determine how bad the block is so that only certain blocks with multiple word lines and multiple portions that are bad will be marked as bad. In step 1016, data stored in the block is reprogrammed to a new block. In step 1018, controller 244 will count the number of bad blocks. In step 1020, controller 244 (optionally) adjusts the thresholds used for the first and/or second phases of testing based on the count of number of bad blocks in step 1020). Examples of threshold that are adjusted include K1, K2 and K3, described above. Another embodiment includes adding a step to FIG. 24 after step 1020 (or to FIG. 18 after step 818) in which the number of free blocks are counted taking under consideration the new bad block. If the number of free blocks is smaller than some threshold, then the non-volatile memory (e.g., memory array(s) 200) is considered full and cannot be programmed with new data until some data is first erased from it. This is different than prior art that checks for the number of free blocks only before programming of new data to the storage device.

In one example implementation of FIG. 24, the portion of the block considered includes memory cells connected to a common word line. The controller will perform the first phase of testing on each word line. If a word line fails the first phase of testing, then that word line is subjected to the second phase of testing, as described in FIG. 24.

Figure 25:
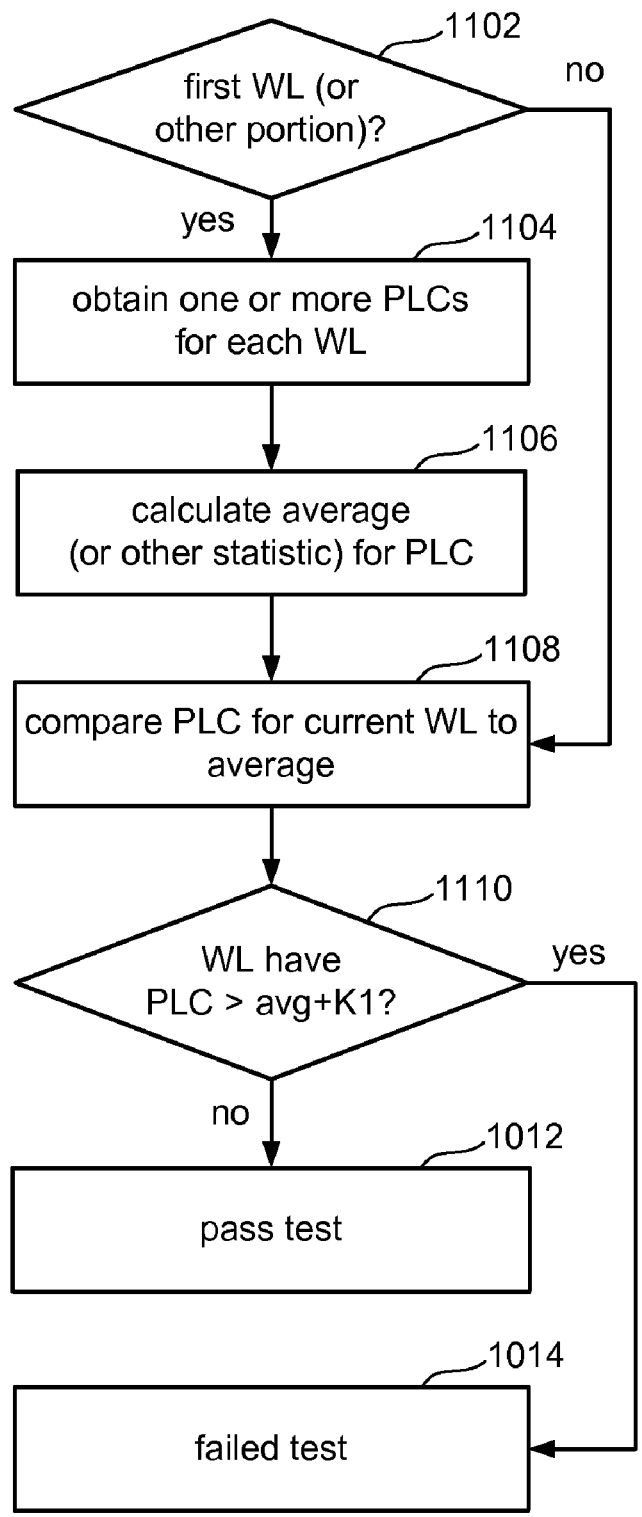
FIG. 25 is a flow chart describing one embodiment of a process for performing a test when checking whether blocks are prone to fail.

FIG. 25 is a flow chart describing one embodiment of performing the first phase of testing on a portion of a block (step 1000 of FIG. 24) when the portion of the block is a word line. If the current word line being operated on is the first word line in the block to be operated on (step 1102), then controller 244 will obtain one or more program loop counts PLC for each word line (as described above) in step 1104. In step 1106, controller 244 will calculate the average for the program loop counts PLC that were obtained in step 1104. In step 1108, controller 244 will compare the program loop count PLC for the current word line to the average. If, in step 1110, the program loop count PLC for the current word line is greater than the average by K1 (e.g., PLC>avg+K1), then the block fails the first phase of testing (step 1014). If the program loop count PLC for the current word line is not greater than the average plus K1 (step 1110), then the block passes.

Figure 26:
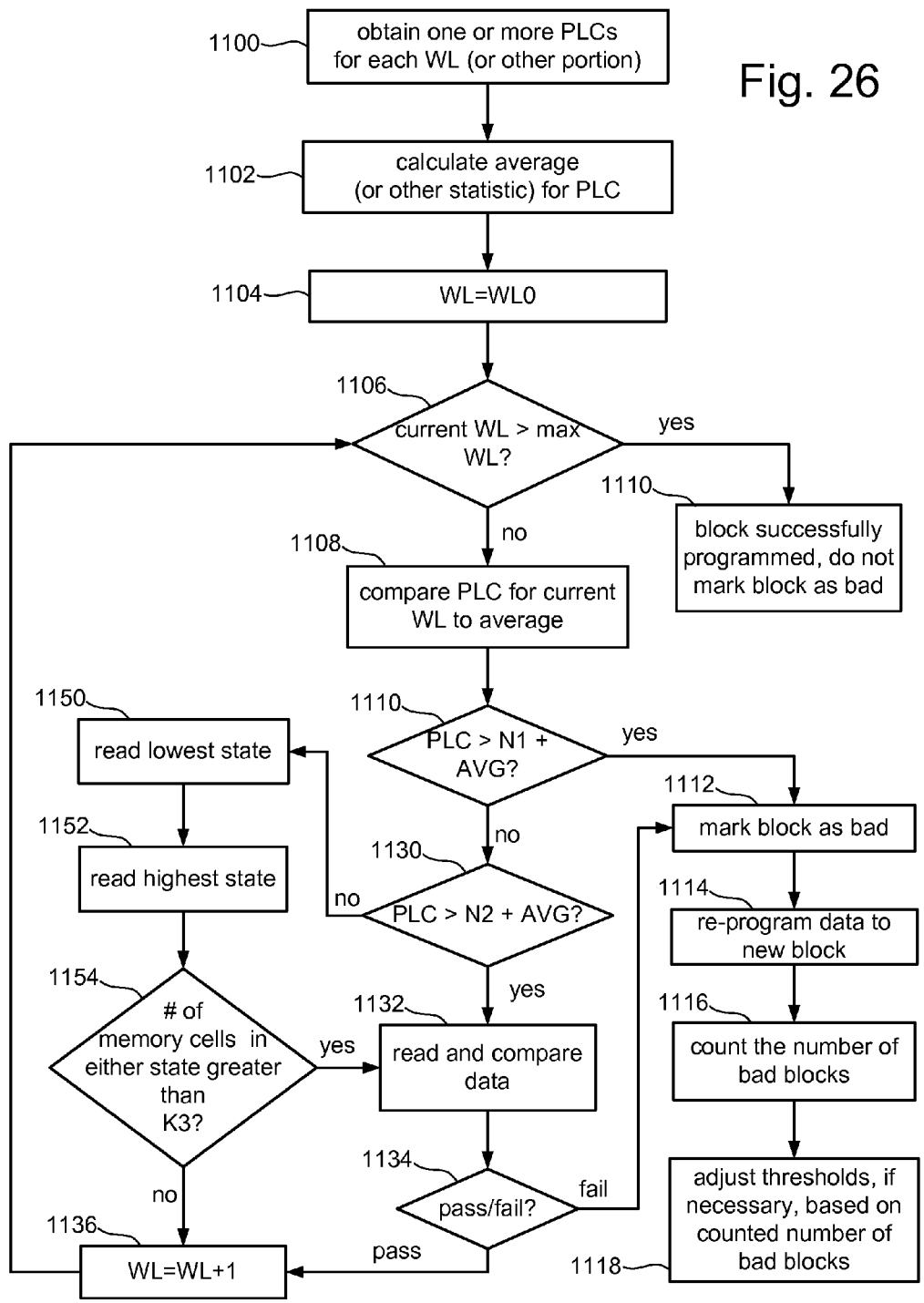
FIG. 26 is a flow chart describing one embodiment of a process for performing a test when checking whether blocks are prone to fail.

FIG. 26 depicts a flow chart describing another embodiment of a process for checking for and managing blocks prone to fail (step 638 of FIG. 11). In step 1100, controller 244 obtains one or more program loop counts PLC for each word line in the block (or other portion of the block). Any of the various embodiments described above for obtaining the program loop counts PLC can be used. In step 1102, the average is calculated of the program loop counts PLC obtained in step 1100. In step 1104, the first word line is selected. In step 1106, controller 244 determines whether the current word line selected is greater than the maximum number of word lines. If so, then the block has successfully programmed (step 1110). Therefore, no blocks are marked as bad.

If the current word line selected is not greater than the maximum number of word lines (step 1106), then in step 1108 the program loop count PLC for the current word line is compared to the average of all the program loop counts obtained in step 1100. If the program loop count PLC for the current word line is greater than the average by more than N1 (e.g., 10), then the block is marked as bad in step 1112. In step 1114, data selected to be programmed for said block is reprogrammed to a new block. In step 1116, controller 244 will count the number of bad blocks. In step 1118, controller 244 adjusts the thresholds, if necessary, based on the counted number of bad blocks. Examples of thresholds include N1, N2, K3 and any threshold used in step 1132 (described below). Steps 1116 and 1118 are optional.

In step 1110, if it is determined that the PLC for the current word line is not greater than the average PLC (see step 1102) plus N1, then in step 1130 it is determined whether the PLC for the current word line is greater than the average PLC (see step 1102) plus N2. One example of N2 is 6. If the PLC for the current word line is greater than N2 plus the average, then the block is marked as suspicious and at step 1132, controller 244 will read the data for the current word line and compare it to the data in the buffer cache 504. If the comparison in step 1132 fails (step 1134), then the block is marked as bad in step 1112 and the process continues to step 1114. In one example, the comparison of step 1132 will fail if the number of error bits between the data read and the data in buffer cache 504 is 72 or greater. Other thresholds for the number of error bits can also be used. If the comparison of step 1132 passes (e.g., because the number of errors is less than 72), then the next word line is chosen (step 1136) and the process loops back to step 1106. In some embodiments, rather than test all of the bits for a word line, controller 244 will only test data for a portion (e.g., 25%) of the memory cells connected to the word line that are furthest from the word line driver.

If, in step 1130, controller 244 determines that the PLC for the current word line is not greater than N2 plus the average, then in step 1150, controller 244 will read the data in the lowest state to determine the number of memory cells in the lowest state (e.g., state 0). In step 1152, controller 244 will read data in the highest state to determine the number of memory cells in the highest state (e.g., state 'F' for the case of 16 states). In step 1154, it is determined whether the number of memory cells in either the lowest state or the highest state is greater than K3. If so, the process continues to step 1132. If not, the process continues to step 1136. In some embodiments, steps 1150-54 will only operate on data for a portion (e.g., 25%) of the memory cells connected to the word line that are furthest from the word line driver.

The process of FIG. 26 includes two thresholds for the first phase of testing and if the block fails one of the thresholds (see step 1110), the block is marked bad without performing the second phase of testing. Another difference in FIG. 26 is that there are three phases of testing. The first phase of testing includes comparing the PLC, the second phase of testing includes reading the number of memory cells in the lowest and highest states, and the third phase of testing includes comparing the read data after programming to the data in the buffer cache. Alternatively, the process of FIG. 26 can be thought of as two phases testing, in which the first phase of testing includes comparing the PLC (step 1108) and determining whether the number of memory cells in the lowest and highest states deviates by more than a threshold (steps 1150-1154), and the second phase include comparing the data in step 1132.

As described above, the controller 244 identifies blocks prone to fail based on performance data. Other performance data, in addition to the performance data described above, can also be used. For example, programming current, read current, number of ECC iterations, number of slow programming memory cells, number of over programmed memory cells, as well as other parameters, can also be used for either the first phase of testing or the second phase of testing.

One embodiment of the technology described above includes programming first data into a first set of non-volatile storage elements, (after successfully completing the programming) determining whether the first set of non-volatile storage elements are prone to fail, and (if the first set of non-volatile storage elements are prone to fail) re-programming the first data to a second set of non-volatile storage elements that are different than the first set of non-volatile storage elements.

One embodiment includes changing data stored (e.g., programming, erasing, or other) in a first set of non-volatile storage elements, (after the changing data) performing a first test on the first set of non-volatile storage elements to determine whether the first set of non-volatile storage elements are prone to fail, (if the first set of non-volatile storage elements fail the first test due to a first condition) performing a second test on the first set of non-volatile storage elements to determine whether the first set of non-volatile storage elements are prone to fail, and (if the first set of non-volatile storage elements fail the second test), marking the first set of non-volatile storage elements as bad.

One embodiment includes changing data stored in non-volatile storage elements connected to a particular word line of a memory system. The changing data includes performing multiple iterations of a memory operation and maintaining a particular memory operation loop counter for the non-volatile storage elements connected to the particular word line that indicates how many iterations of the memory operation were performed. The process further comprises comparing the particular memory loop counter to data based on other memory loop counters for the memory system and determining whether the non-volatile storage elements connected to the particular word line are prone to fail based on the comparing.

One embodiment includes programming first data into non-volatile storage elements connected to a particular word line of a memory system. The memory system includes a controller and a memory circuit. The memory circuit includes a memory array and support circuitry. The memory array includes blocks of non-volatile storage elements. Each block includes a plurality of word lines. The particular word line is in a particular block. The programming includes performing multiple iterations of a programming operation and maintaining a program loop counter that indicates how many iterations of the programming operation were performed. The method further includes the controller determining a number of non-volatile storage elements connected to the particular word line that have their threshold voltage within a particular interval of threshold voltages. The process further includes the controller determining whether the particular block is bad based on the determined number of non-volatile storage elements connected to the particular word line that have their threshold voltage within the particular interval, the determining whether the particular block is bad is performed by the controller, and programming the first data into non-volatile storage elements connected to a different word line of a different block of the memory system if the particular block is determined to be bad.

One embodiment includes a memory circuit including plurality of non-volatile storage elements and a controller in communication with the memory circuit. The controller causes a first set of the non-volatile storage elements to change storage conditions. After the changing storage conditions, the controller performs a first test on the first set of non-volatile storage elements to determine whether the first set of non-volatile storage elements are prone to fail. If the first set of non-volatile storage elements fail the first test due to a first condition, then the controller performs a second test on the first set of non-volatile storage elements to determine whether the first set of non-volatile storage elements are prone to fail. If the first set of non-volatile storage elements fail the second test, then the controller marks the first set of non-volatile storage elements as bad.

One embodiment includes a memory circuit including plurality of non-volatile storage elements and a controller in communication with the memory circuit. The controller causes programming of first data into a first set of non-volatile storage elements. After successfully completing the programming, the controller determines whether the first set of non-volatile storage elements are prone to fail. If the first set of non-volatile storage elements are prone to fail, then the controller re-programs the first data to a second set of non-volatile storage elements that are different than the first set of non-volatile storage elements.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A method for detecting at-risk non-volatile storage elements, comprising:
    programming first data into a first set of non-volatile storage elements;
    after successfully completing the programming, determining whether the first set of non-volatile storage elements are prone to fail; and
    if the first set of non-volatile storage elements are prone to fail, re-programming the first data to a second set of non-volatile storage elements that are different than the first set of non-volatile storage elements;
    wherein the determining whether the first set of non-volatile storage elements are prone to fail comprises:

performing a first test on the first set of non-volatile storage elements to determine whether the first set of non-volatile storage elements are prone to fail, if the first set of non-volatile storage elements fail the first test, performing a second test on the first set of non-volatile storage elements to determine whether the first set of non-volatile storage elements are prone to fail, and concluding that the first set of non-volatile storage elements are prone to fail if the first set of non-volatile storage elements fail the second test;

wherein the programming includes performing multiple iterations of a programming operation and maintaining a particular programming loop counter for the first set of non-volatile storage elements;

wherein the performing the first test comprises comparing the particular memory loop counter to data based on other memory loop counters.

2. A method for detecting at-risk non-volatile storage elements, comprising:

programming first data into a first set of non-volatile storage elements;

after successfully completing the programming, determining whether the first set of non-volatile storage elements are prone to fail; and if the first set of non-volatile storage elements are prone to fail, re-programming the first data to a second set of non-volatile storage elements that are different than the first set of non-volatile storage elements;

wherein the determining whether the first set of non-volatile storage elements are prone to fail comprises:

performing a first test on the first set of non-volatile storage elements to determine whether the first set of non-volatile storage elements are prone to fail, if the first set of non-volatile storage elements fail the first test, performing a second test on the first set of non-volatile storage elements to determine whether the first set of non-volatile storage elements are prone to fail, and concluding that the first set of non-volatile storage elements are prone to fail if the first set of non-volatile storage elements fail the second test.

3. The method of claim 2, wherein:
the second test is performed slower than the first test.

4. The method of claim 2, wherein:
the first set of non-volatile storage elements are connected to a particular word line of a memory system, the memory system includes a controller and a memory circuit, the memory circuit includes a memory array and support circuitry, the memory array includes blocks of non-volatile storage elements, each block includes a plurality of word lines, the particular word line is in a particular block, the programming includes performing multiple iterations of a programming operation and maintaining a particular program loop counter in the memory circuit that indicates how many iterations of the programming operation were performed for the first set of non-volatile storage elements; and the performing the first test includes the controller performing a method comprising retrieving the particular program loop counter from the memory circuit, retrieving other program loop counters from the memory circuit for non-volatile storage elements connected to other word lines of the particular block, calculating an average of the retrieved particular program loop counter and other program loop counters, determining whether the particular program loop counter is within a range of the average, and concluding that the first set of non-volatile storage elements have failed the first test if the particular program loop counter is not within the range of the average.

5. The method of claim 2, wherein the performing the second test includes:

reading the first data stored in the first set of non-volatile storage elements;

comparing the first data read with original data; and determining whether an amount of differences between first data read and the original data is less than a reference number, the first set of non-volatile storage elements fail the second test if the amount of differences between first data read and the original data is not less than the reference number.

6. The method of claim 2, wherein the performing the second test includes:

determining a threshold voltage distribution of a population of non-volatile storage elements that includes the first set of non-volatile storage elements;

identifying multiple minima points; and calculating a number of non-volatile storage elements of the population that are between two of the minima points, the first set of non-volatile storage elements fail the second test if the number of non-volatile storage elements of the population that are between the two minima points is greater than a compare value.

7. The method of claim 6, wherein:
the population of non-volatile storage elements is the first set of non-volatile storage elements.

8. The method of claim 2, wherein:
the first set of non-volatile storage elements are connected to a particular word line of a memory system, the memory system includes a controller and a memory circuit, the memory circuit includes a memory array and support circuitry, the memory array includes a plurality of word lines including a particular word line; and the performing the second test includes the controller determining a number of the first set of non-volatile storage elements that have their threshold voltage within an interval of threshold voltages and determining that the first set of non-volatile storage elements fail the second test if the number of the first set of non-volatile storage elements that have their threshold voltage within an interval is outside a range.

9. The method of claim 8, wherein:
the interval includes threshold voltage values that are between a first voltage and a second voltage.

10. The method of claim 8, wherein:
the interval includes threshold voltage values that are below a first voltage.

11. The method of claim 8, wherein:
the interval includes threshold voltage values that are above a first voltage.

12. The method of claim 8, wherein:
the programming includes performing multiple iterations of a programming operation and maintaining a particular program loop counter in the memory circuit that indicates how many iterations of the programming operation were performed for the first set of non-volatile storage elements; and the performing the first test includes the controller performing a method comprising retrieving the particular program loop counter from the memory circuit, retrieving other program loop counters from the memory circuit for non-volatile storage elements connected to other word lines of the particular block, calculating an average of the retrieved particular program loop counter and other program loop counters, determining whether the particular program loop counter is within a range of the average, and concluding that the first set of non-volatile storage elements have failed the first test if the particular program loop counter is not within a range of the average.

13. A method for detecting at-risk non-volatile storage elements, comprising:
programming first data into a first set of non-volatile storage elements;
after successfully completing the programming, determining whether the first set of non-volatile storage elements are prone to fail; and
if the first set of non-volatile storage elements are prone to fail, re-programming the first data to a second set of non-volatile storage elements that are different than the first set of non-volatile storage elements;
wherein the determining whether the first set of non-volatile storage elements are prone to fail comprises:
performing a first test on the first set of non-volatile storage elements to determine whether the first set of non-volatile storage elements are prone to fail;
if the first set of non-volatile storage elements fail the first test due to a first condition, performing a second test on the first set of non-volatile storage elements to determine whether the first set of non-volatile storage elements are prone to fail;
concluding that the first set of non-volatile storage elements are prone to fail if the first set of non-volatile storage elements fail the second test; and
concluding that the first set of non-volatile storage elements are prone to fail if the first set of non-volatile storage elements fail the first test due to a second condition.

14. A method for detecting at-risk non-volatile storage elements, comprising:
programming first data into a first set of non-volatile storage elements;
after successfully completing the programming, determining whether the first set of non-volatile storage elements are prone to fail;
if the first set of non-volatile storage elements are prone to fail, re-programming the first data to a second set of non-volatile storage elements that are different than the first set of non-volatile storage elements;
if the first set of non-volatile storage elements are prone to fail, marking the first set of non-volatile storage elements as bad;
determining a number of units of non-volatile storage elements that have been marked as bad, the determining whether the first set of non-volatile storage elements are prone to fail includes performing a test for the first set of non-volatile storage elements; and
adjusting the test based on the number of units of non-volatile storage elements that have been marked as bad.

15. A method for detecting at-risk non-volatile storage elements, comprising:
changing data stored in a first set of non-volatile storage elements;
after the changing data, performing a first test on the first set of non-volatile storage elements to determine whether the first set of non-volatile storage elements are prone to fail;
if the first set of non-volatile storage elements fail the first test due to a first condition, performing a second test on the first set of non-volatile storage elements to determine whether the first set of non-volatile storage elements are prone to fail; and
if the first set of non-volatile storage elements fail the second test, marking the first set of non-volatile storage elements as bad.

16. The method of claim 15, further comprising:
if the first set of non-volatile storage elements fail the first test due to a second condition that is different than the first condition, marking the first set of non-volatile storage elements as bad.

17. The method of claim 16, wherein:
the changing data includes performing multiple iterations of a memory operation and maintaining a particular loop counter for the first set of non-volatile storage elements indicating a number of iterations of the memory condition for the first set of non-volatile storage elements;
the performing the first test comprises comparing the particular loop counter to data based on loop counters for non-volatile storage elements other than the first set;
the first condition is a first variance between the particular loop counter and the data based on loop counters for non-volatile storage elements other than the first set; and
the second condition is a second variance between the particular loop counter and the data based on loop counters for non-volatile storage elements other than the first set.

18. The method of claim 15, wherein:
the changing data includes performing multiple iterations of a memory operation and maintaining a particular loop counter for the first set of non-volatile storage elements indicating a number of iterations of the memory condition for the first set of non-volatile storage elements;
the performing the first test comprises comparing the particular loop counter to data based on loop counters for non-volatile storage elements other than the first set; and
the first condition is a variance between the particular loop counter and the data based on loop counters for non-volatile storage elements other than the first set that is greater than a value.

19. The method of claim 15, further comprising:
determining a number of units of non-volatile storage elements that have been marked as bad; and
adjusting the first test based on the number of units of non-volatile storage elements that have been marked as bad.

20. The method of claim 15, wherein:
the changing data includes either programming or erasing.

21. A method for detecting at-risk non-volatile storage elements, comprising:
programming first data into non-volatile storage elements connected to a particular word line of a memory system, the memory system includes a controller and a memory circuit, the memory circuit includes a memory array and support circuitry, the memory array includes blocks of non-volatile storage elements, each block includes a plurality of word lines, the particular word line is in a particular block, the programming includes performing multiple iterations of a programming operation and maintaining a program loop counter that indicates how many iterations of the programming operation were performed;
determining a number of non-volatile storage elements connected to the particular word line that have their threshold voltage within a particular interval of threshold voltages, the determining a number of non-volatile storage elements is performed by the controller;

determining whether the particular block is bad based on the determined number of non-volatile storage elements connected to the particular word line that have their threshold voltage within the particular interval, the determining whether the particular block is bad is performed by the controller; and
programming the first data into non-volatile storage elements connected to a different word line of a different block of the memory system if the particular block is determined to be bad.

22. The method of claim 21, wherein:
the particular interval includes threshold voltage values that are between a first voltage and a second voltage.

23. The method of claim 21, wherein:
the particular interval includes threshold voltage values that are below a first voltage.

24. The method of claim 21, wherein:
the particular interval includes threshold voltage values that are above a first voltage.

25. A non-volatile storage apparatus, comprising:
a memory circuit including plurality of non-volatile storage elements; and
a controller in communication with the memory circuit, the controller causes a first set of the non-volatile storage elements to change storage conditions, after the changing storage conditions the controller performs a first test on the first set of non-volatile storage elements to determine whether the first set of non-volatile storage elements are prone to fail, if the first set of non-volatile storage elements fail the first test due to a first condition then the controller performs a second test on the first set of non-volatile storage elements to determine whether the first set of non-volatile storage elements are prone to fail, if the first set of non-volatile storage elements fail the second test then the controller marks the first set of non-volatile storage elements as bad.

26. The non-volatile storage apparatus of claim 25, wherein:
if the first set of non-volatile storage elements fail the first test due to a second condition that is different than the first condition, then the controller marks the first set of non-volatile storage elements as bad.

27. The non-volatile storage apparatus of claim 26, wherein:
the changing storage conditions includes the memory circuit performing multiple iterations of a memory operation and maintaining a particular loop counter for the first set of non-volatile storage elements indicating the number of iterations of the memory operation for the first set of non-volatile storage elements;
the performing the first test comprises the controller comparing the particular loop counter to data based on loop counters for non-volatile storage elements other than the first set;
the first condition is a first variance between the particular loop counter and the data based on loop counters for non-volatile storage elements other than the first set; and
the second condition is a second variance between the particular loop counter and the data based on loop counters for non-volatile storage elements other than the first set.

28. The non-volatile storage apparatus of claim 25, wherein:
the changing storage conditions includes the memory circuit performing multiple iterations of a memory operation and maintaining a particular loop counter for the first set of non-volatile storage elements indicating the number of iterations of the memory operation for the first set of non-volatile storage elements;
the performing the first test comprises the controller comparing the particular loop counter to data based on loop counters for non-volatile storage elements other than the first set; and
the first condition is a variance between the particular loop counter and the data based on loop counters for non-volatile storage elements other than the first set that is greater than a value.

29. The non-volatile storage apparatus of claim 25, wherein:
the controller determines a number of units of non-volatile storage elements that have been marked as bad and adjusts the first test based on the number of units of non-volatile storage elements that have been marked as bad.

30. A non-volatile storage apparatus, comprising:
a memory circuit including plurality of non-volatile storage elements and a plurality of word lines; and
a controller in communication with the memory circuit, the controller causes programming of first data into a first set of the non-volatile storage elements, after successfully completing the programming the controller determines whether the first set of non-volatile storage elements are prone to fail, if the first set of non-volatile storage elements are prone to fail then the controller re-programs the first data to a second set of non-volatile storage elements that are different than the first set of non-volatile storage elements, the first set of non-volatile storage elements are connected to a particular word line of the plurality, the controller determines whether the first set of non-volatile storage elements are prone to fail by determining a number of the first set of non-volatile storage elements that have their threshold voltage within an interval of threshold voltages, the first set of non-volatile storage elements are prone to fail if the number of the first set of non-volatile storage elements that have their threshold voltage within an interval is outside an expected range.

31. A method for detecting at-risk non-volatile storage elements, comprising:
erasing a first set of non-volatile storage elements, the erasing includes performing multiple iterations of an erase operation and maintaining an erase loop counter for the first set of non-volatile storage elements indicating a number of iterations for the first set of non-volatile storage elements;
after the erasing, performing a first test on the first set of non-volatile storage elements to determine whether the first set of non-volatile storage elements are prone to fail, the performing the first test comprises comparing the erase loop counter to data based on loop counters for non-volatile storage elements other than the first set;
if the first set of non-volatile storage elements fail the first test due to a first condition, performing a second test on the first set of non-volatile storage elements to determine whether the first set of non-volatile storage elements are prone to fail; and
if the first set of non-volatile storage elements fail the second test, marking the first set of non-volatile storage elements as bad.

* * * * *